(12) United States Patent
Yonemaru et al.

(10) Patent No.: US 10,178,783 B2
(45) Date of Patent: Jan. 8, 2019

(54) DISPLAY DEVICE

(71) Applicant: NEC Platforms, Ltd., Kawasaki-shi, Kanagawa (JP)

(72) Inventors: Shinichirou Yonemaru, Kanagawa (JP); Katsumi Harashima, Kanagawa (JP); Takahiro Iwamoto, Kanagawa (JP)

(73) Assignee: NEC Platforms, Ltd., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/571,070

(22) PCT Filed: Feb. 3, 2016

(86) PCT No.: PCT/JP2016/000559
§ 371 (c)(1),
(2) Date: Nov. 1, 2017

(87) PCT Pub. No.: WO2016/185639
PCT Pub. Date: Nov. 24, 2016

(65) Prior Publication Data
US 2018/0168053 A1    Jun. 14, 2018

(30) Foreign Application Priority Data
May 15, 2015 (JP) ................................. 2015-099951

(51) Int. Cl.
*H05K 5/00* (2006.01)
*H05K 5/02* (2006.01)
(Continued)

(52) U.S. Cl.
CPC ........... *H05K 5/0217* (2013.01); *G06F 3/041* (2013.01); *G09F 9/00* (2013.01); *H05K 5/0004* (2013.01);
(Continued)

(58) Field of Classification Search
None
See application file for complete search history.

(56) References Cited

U.S. PATENT DOCUMENTS 6,507,484 B2 * 1/2003 Fukuyoshi ........ G02F 1/133308
                                                                  345/156
6,660,427 B1 * 12/2003 Hukill ................. H01M 2/1066
                                                                  361/600
(Continued)

FOREIGN PATENT DOCUMENTS

JP     2001-083900 A    3/2001
JP     2006-227712 A    8/2006
(Continued)

OTHER PUBLICATIONS

Written Opinion for PCT/JP2016/000559, dated May 10, 2016.
International Search Report for PCT/JP2016/000559, dated May 10, 2016.

*Primary Examiner* — Xanthia C Cunningham
(74) *Attorney, Agent, or Firm* — Sughrue Mion, PLLC

(57) ABSTRACT

A display device of this invention, includes a front case including a touch panel; and a rear case including a lock unit, which is configured to regulate movement of the front case, and a display unit, in which the front case is mounted to the rear case by inserting a protrusion that is formed in a peripheral edge portion of the front case into a guide groove that is formed in an outer edge portion of the rear case to bring the front case into contact with the rear case, subsequently moving the front case along the guide groove to engage the protrusion with the guide groove, and moving the lock unit of in the rear case from a first position to a second position, which is different from the first position, to regulate the movement of the front case.

6 Claims, 26 Drawing Sheets

(a)

(b)

(51) Int. Cl.
*G06F 3/041* (2006.01)
*G09F 9/00* (2006.01)

(52) U.S. Cl.
CPC ......... H05K 5/0017 (2013.01); H05K 5/0221 (2013.01)

(56) References Cited

U.S. PATENT DOCUMENTS

| | | | | |
|---|---|---|---|---|
| 7,004,614 | B2* | 2/2006 | Tsai | G02B 6/0031 |
| | | | | 349/58 |
| 7,236,357 | B2* | 6/2007 | Chen | G06F 1/1616 |
| | | | | 312/223.1 |
| 7,800,891 | B2* | 9/2010 | Shi | H04M 1/0252 |
| | | | | 280/728.2 |
| 7,961,457 | B2* | 6/2011 | Huang | G02F 1/133308 |
| | | | | 349/58 |
| 8,009,415 | B2* | 8/2011 | Xia | G06F 1/1616 |
| | | | | 16/382 |
| 8,659,910 | B2* | 2/2014 | Cheng | G06F 1/1679 |
| | | | | 361/755 |
| 8,736,783 | B2* | 5/2014 | Lo | G06F 1/1637 |
| | | | | 349/58 |
| 8,854,811 | B2* | 10/2014 | Cheng | G06F 1/1633 |
| | | | | 174/520 |
| 9,740,243 | B2* | 8/2017 | Urimoto | G06F 1/1635 |
| 9,807,891 | B2* | 10/2017 | Tsukahara | H05K 5/0017 |
| 9,983,631 | B2* | 5/2018 | Senatori | G06F 1/1656 |
| 2003/0063432 | A1* | 4/2003 | Farrow | G06F 1/1601 |
| | | | | 361/679.02 |
| 2005/0213291 | A1* | 9/2005 | Chi | G06F 1/1616 |
| | | | | 361/679.21 |
| 2006/0002060 | A1* | 1/2006 | Ling | G06F 1/1616 |
| | | | | 361/679.21 |
| 2006/0050474 | A1* | 3/2006 | Kusaka | G06F 1/1616 |
| | | | | 361/679.02 |
| 2006/0192657 | A1 | 8/2006 | Nishimura et al. | |
| 2007/0132908 | A1* | 6/2007 | Kim | G02F 1/133308 |
| | | | | 349/58 |
| 2010/0188597 | A1* | 7/2010 | Koike | G02F 1/133308 |
| | | | | 349/58 |
| 2011/0001712 | A1 | 1/2011 | Saito | |
| 2012/0236541 | A1* | 9/2012 | Chen | G02F 1/133308 |
| | | | | 362/97.2 |
| 2013/0009893 | A1 | 1/2013 | Okumura et al. | |
| 2013/0114018 | A1* | 5/2013 | Kim | G02F 1/133308 |
| | | | | 349/58 |
| 2013/0176672 | A1* | 7/2013 | Richard | F16M 11/10 |
| | | | | 361/679.22 |
| 2013/0209866 | A1* | 8/2013 | Watanabe | H01M 2/1066 |
| | | | | 429/163 |
| 2014/0009051 | A1* | 1/2014 | Liu | H05K 5/0221 |
| | | | | 312/326 |
| 2014/0267957 | A1 | 9/2014 | Iwamoto et al. | |
| 2015/0201509 | A1* | 7/2015 | Le | G02F 1/0105 |
| | | | | 362/97.1 |
| 2015/0245521 | A1* | 8/2015 | Cheng | G06F 1/1613 |
| | | | | 224/191 |

FOREIGN PATENT DOCUMENTS

| | | |
|---|---|---|
| JP | 2011-011136 A | 1/2011 |
| JP | 2012-063473 A | 3/2012 |
| JP | 2013-033111 A | 2/2013 |
| JP | 2013-033458 A | 2/2013 |
| JP | 2013-097013 A | 5/2013 |

* cited by examiner

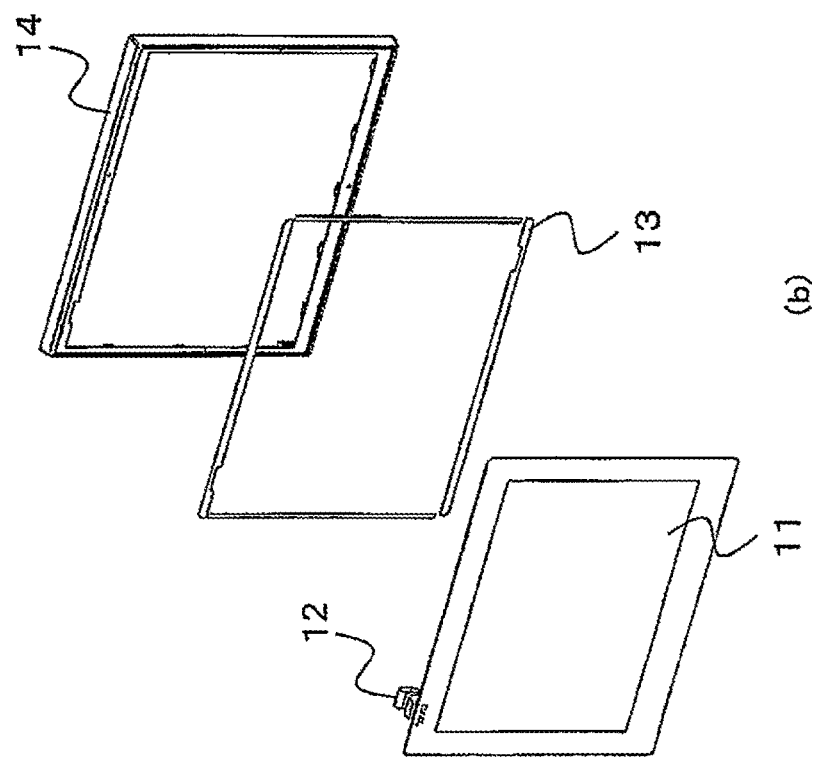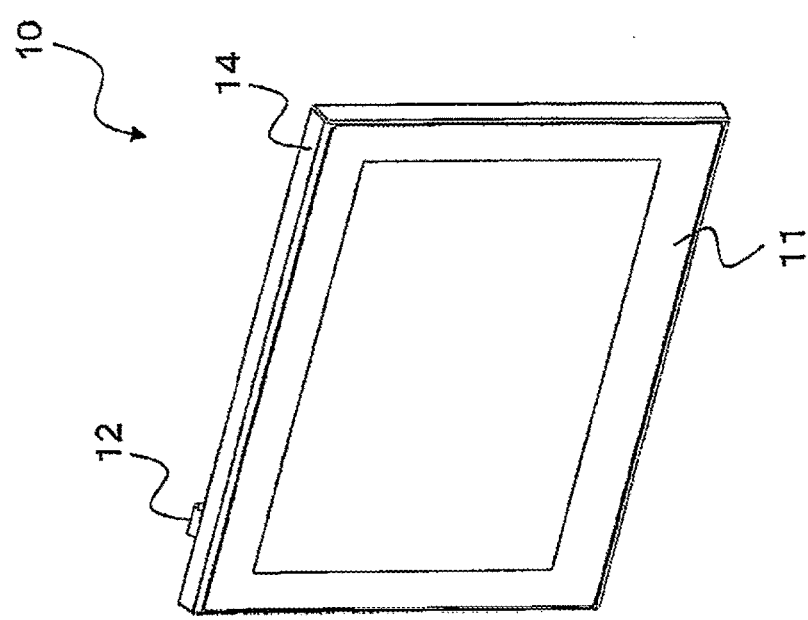
FIG. 2

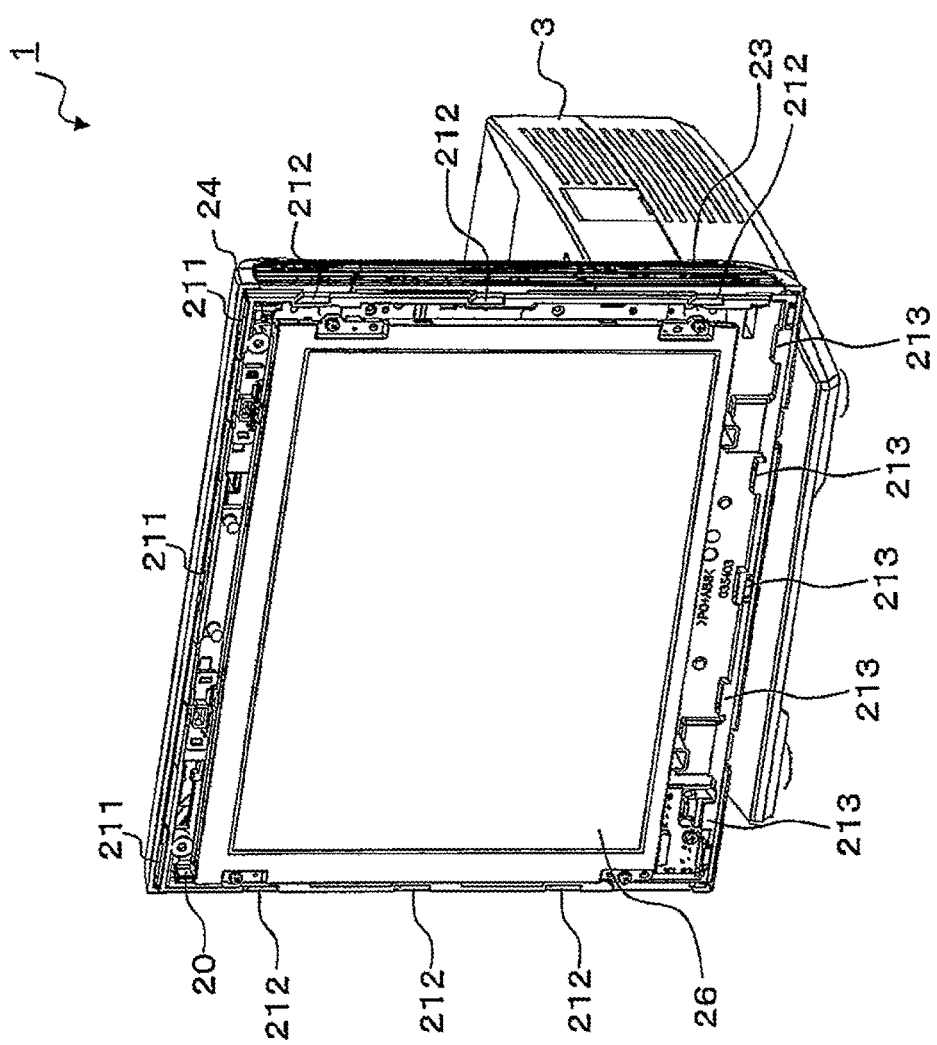

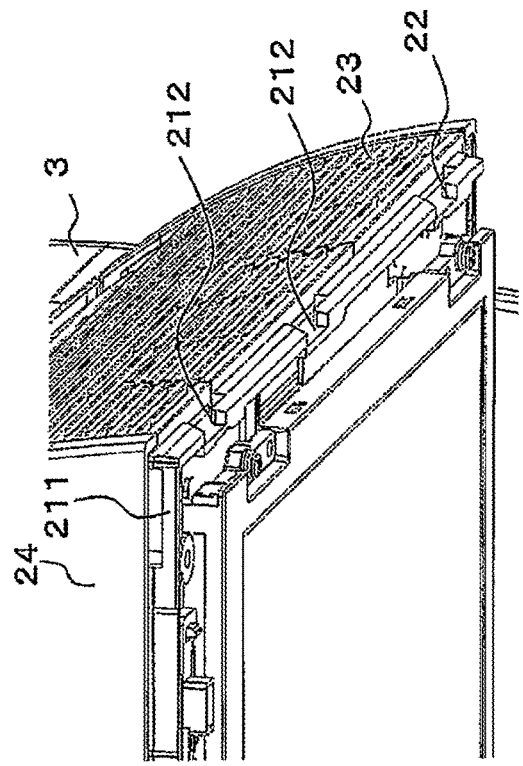
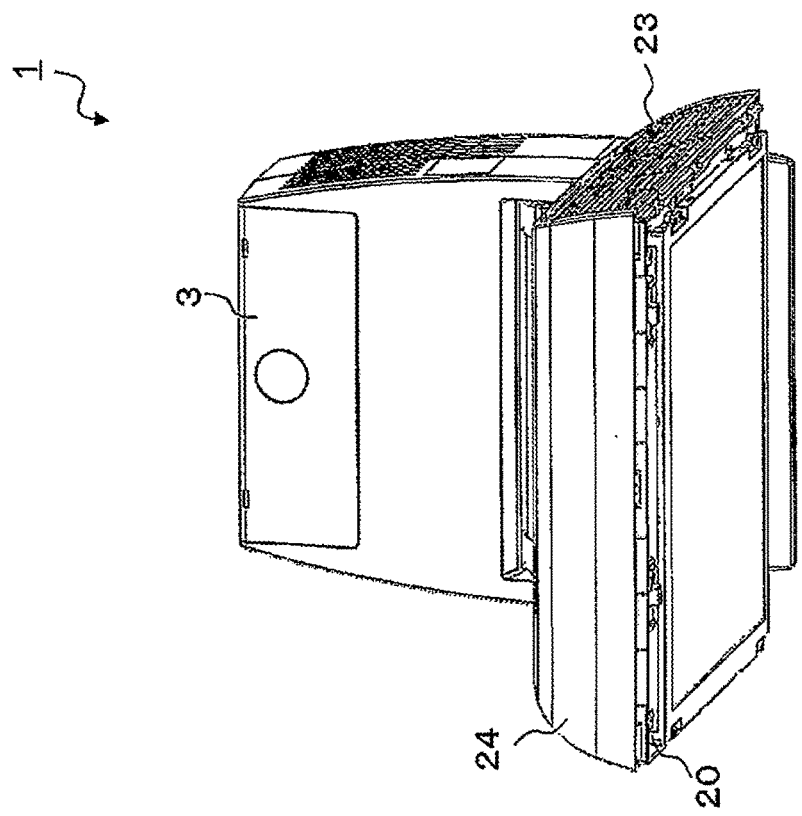
FIG. 14

DISPLAY DEVICE

CROSS REFERENCE TO RELATED APPLICATIONS

This application is a National Stage of International Application No. PCT/JP2016/000559 filed Feb. 3, 2016, claiming priority based on Japanese Patent Application No. 2015-099951 filed May 15, 2015, the contents of all of which are incorporated herein by reference in their entirety.

TECHNICAL FIELD

This invention relates to a display device including a touch panel.

BACKGROUND ART

This type of display device is used as, for example, a peripheral device for an electronic device such as a point of sales (POS) terminal device, or a display section constructed integrally with a main body of an electronic device as one component of the electronic device.

In general, the display device including a touch panel includes a display unit such as a liquid crystal panel, a touch panel arranged on a front side of the display unit, and a case configured to house and support the display unit and the touch panel. When the display device including a touch panel is used over a long period of time, there is a risk in that the display unit including a backlight unit may break down and the touch panel may also break down. When maintenance inspection, repair, or replacement of the touch panel is to be carried out, in general, the touch panel cannot be removed from the display device unless the display unit is removed through work of opening the case, work of unfastening the screws used for fixing the display unit to the case, and the like. Therefore, there is a problem of a drawback to the maintainability of the device.

A display device, which is free of the problem described above and enables easy replacement of the touch panel, is disclosed in Patent Document 1. The display device of Patent Document 1 includes a display unit, a touch panel stacked on the front side of the display unit, and a case configured to house the touch panel and the display unit. The case includes a rear case to which the display unit is installed, and a front case to which the touch panel is installed. The front case is removably mounted to the rear case without requiring a tool for mounting and removal. A disengagement mechanism, which is configured to disengage claws of the front case from recessed portions of the rear case, is provided to the rear case.

PRIOR ART DOCUMENT(S)

Patent Document(s)

Patent Document 1: JP 2013-97013 A

SUMMARY OF THE INVENTION

Problem to be Solved by the Invention

The display device of Patent Document 1 described above, however, has a problem in that the disengagement mechanism configured to disengage the front case from the rear case causes the structure of the display device to be complicated, and, as a result, a production cost is increased.

This invention has an object to provide a display device, which does not include a disengagement mechanism causing the problems described above, and has a simple structure and excellent maintainability.

Means to Solve the Problem

In considering the above-mentioned problem, according to a first aspect of this invention, there is provided a display device, comprising a front case comprising a touch panel, and a rear case comprising a lock unit, which is configured to regulate movement of the front case, and a display unit, wherein the front case is mounted to the rear case by inserting a protrusion that is formed in a peripheral edge portion of the front case into a guide groove that is formed in an outer edge portion of the rear case to bring the front case into contact with the rear case, subsequently moving the front case along the guide groove to engage the protrusion with the guide groove, and moving the lock unit of the rear case from a first position to a second position, which is different from the first position, to regulate the movement of the front case.

Effect of the Invention

According to this invention, the display device having the simple structure and excellent maintainability can be provided.

BRIEF DESCRIPTION OF THE DRAWINGS

FIG. 2 includes views of a front case in the display device illustrated in FIG. 1 as seen from a front side, in which (a) is a perspective view and (b) is an exploded perspective view.

FIG. 8 is a view for illustrating a state in which the front case is removed from the display device illustrated in FIG. 1.

FIG. 14 includes views of the display device illustrated in FIG. 8 as seen from another different angles, in which (a) is a perspective view and (b) is a partially enlarged view.

MODE(S) FOR EMBODYING THE INVENTION

Now, an embodiment of this invention is described in detail with reference to the drawings. Note that, the technical scope of this invention is not interpreted as to be limited to the embodiment described below.

Figure 1:
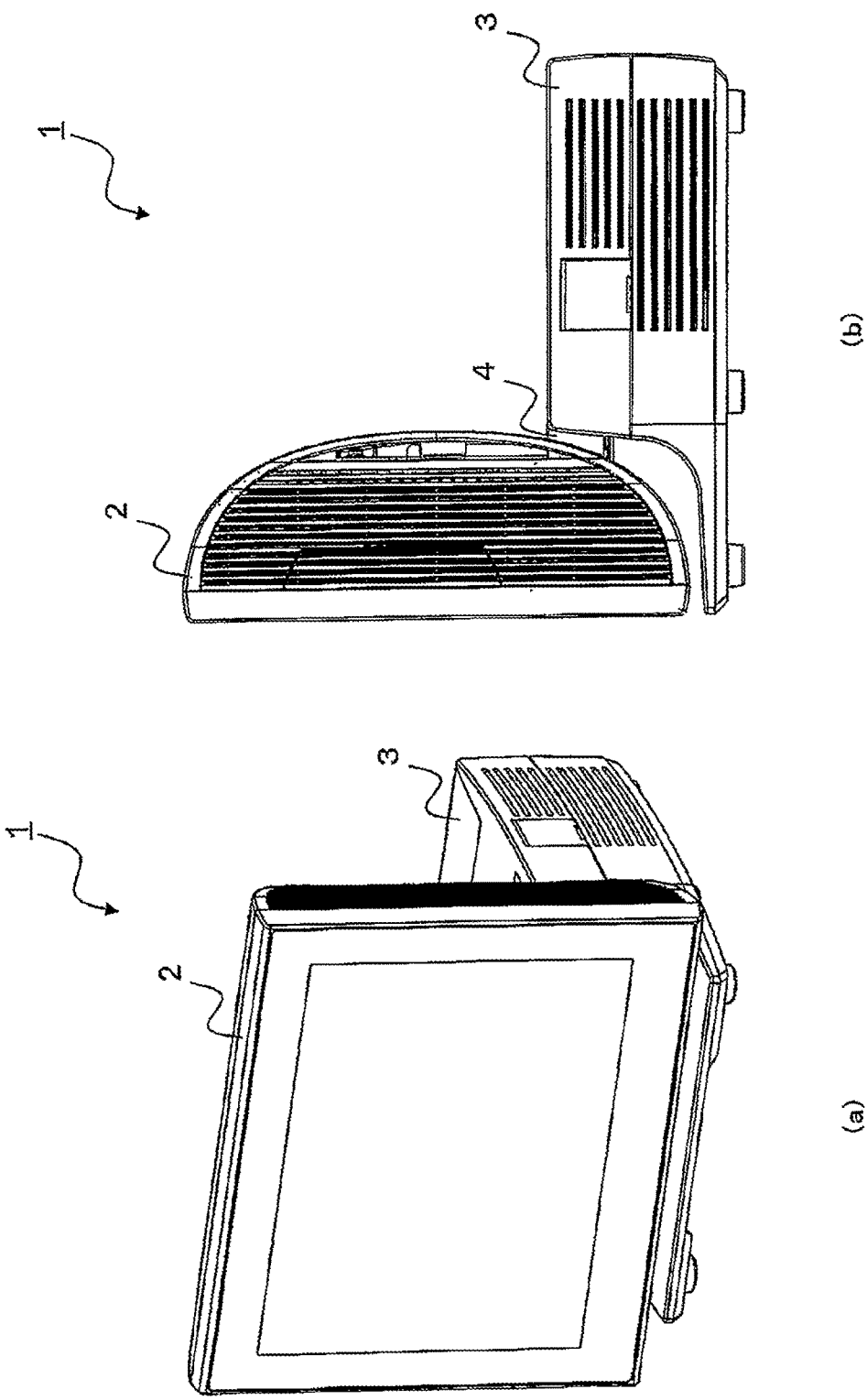
FIG. 1 includes views of a POS terminal device that includes a display device with a touch panel according to an embodiment of the present invention, in which (a) is a perspective view and (b) is a side view.

FIG. 1(a) is a perspective view for illustrating an entire image of an electronic device (a. POS terminal device 1, for example) that includes a display device 2 according to the embodiment of the present invention. FIG. 1(b) is a side view of the electronic device of FIG. 1(a). The POS terminal device 1 is obtained by coupling the display device 2, which is a display section, and a base 3 to each other with a tilt hinge unit 4. The display device 2 includes a touch panel, a liquid crystal display (LCD) or a similar display unit, a control unit configured to perform overall control of the POS terminal device, and other built-in components. The base includes an AC/DC power supply device and other built-in components. The display device 2 may include the touch panel and the display unit, and the base 3 may include the control unit and the AC/DC power supply device.

The display device 2 according to this embodiment includes a display unit 26 (see FIG. 8), a touch panel 11 (see FIG. 2) stacked on a front side of the display unit 26, and a case configured to house the touch panel 11 and the display unit 26. The case includes a rear case 20 (see FIG. 8) to which the display unit 26 is installed, and a front case 10 (see FIG. 2) to which the touch panel 11 is installed. The front case 10 is removably mounted to the rear case 20 without requiring a tool for mounting and removal. The front case 10 has an opening portion through which a touch detection region and a visible region in the stacked touch panel 11 and display unit 26 are exposed.

The display device 2 also includes side covers 23, a top cover 24, and a rear cover 25, which can be removed separately and are described later. The side covers 23, the top cover 24, and the rear cover 25 are fixed to the display device 2 through use of fitting structures, for example, a combination of an engagement protrusion and an engagement hole and a combination of an engagement protrusion and a guide groove, which are described later, and can be removed easily without requiring a special tool.

Figure 3:
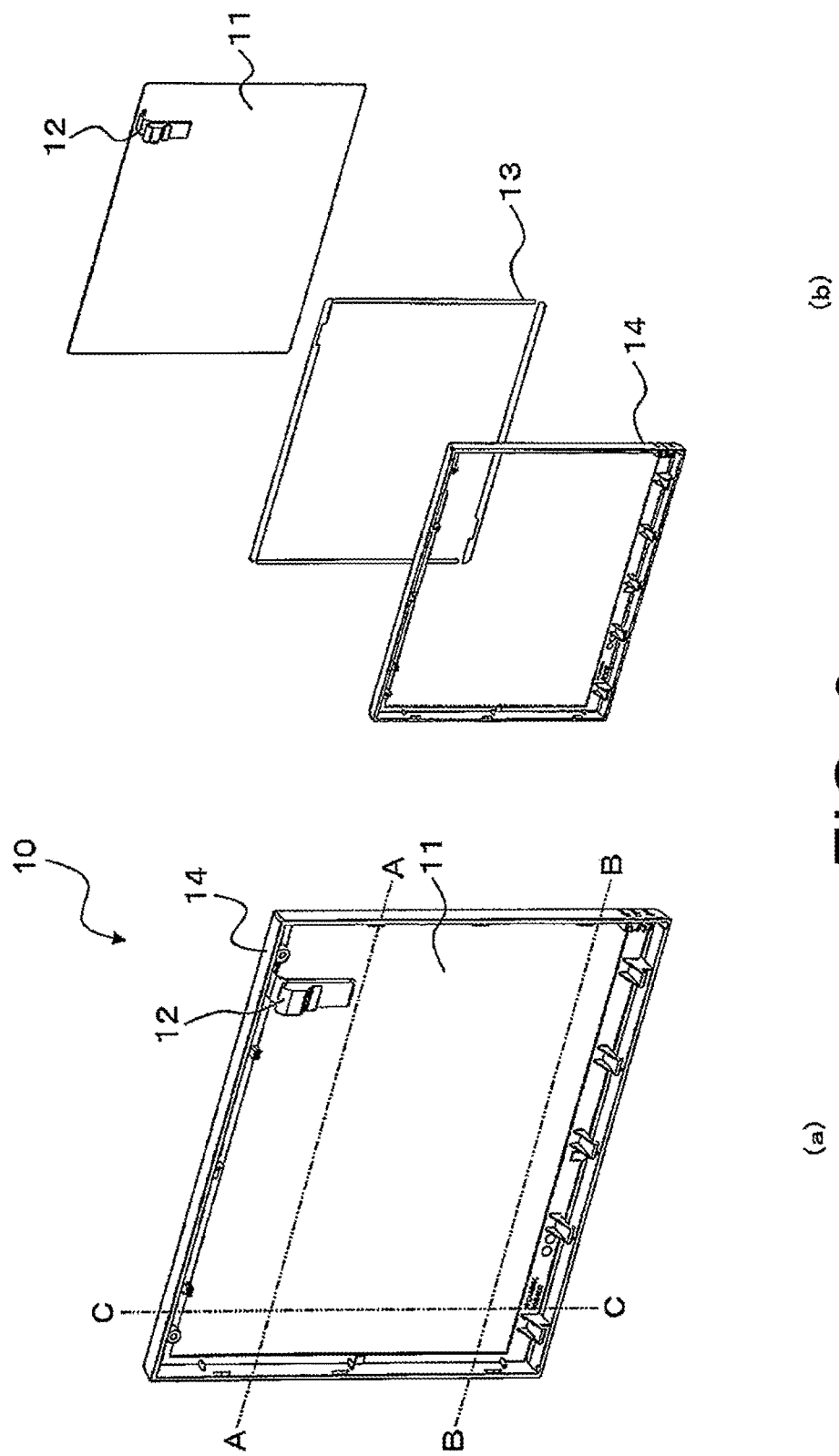
FIG. 3 includes views of the front case illustrated in FIG. 2 as seen from a reverse side, in which (a) is a perspective view and (b) is an exploded perspective view.
Figure 4:
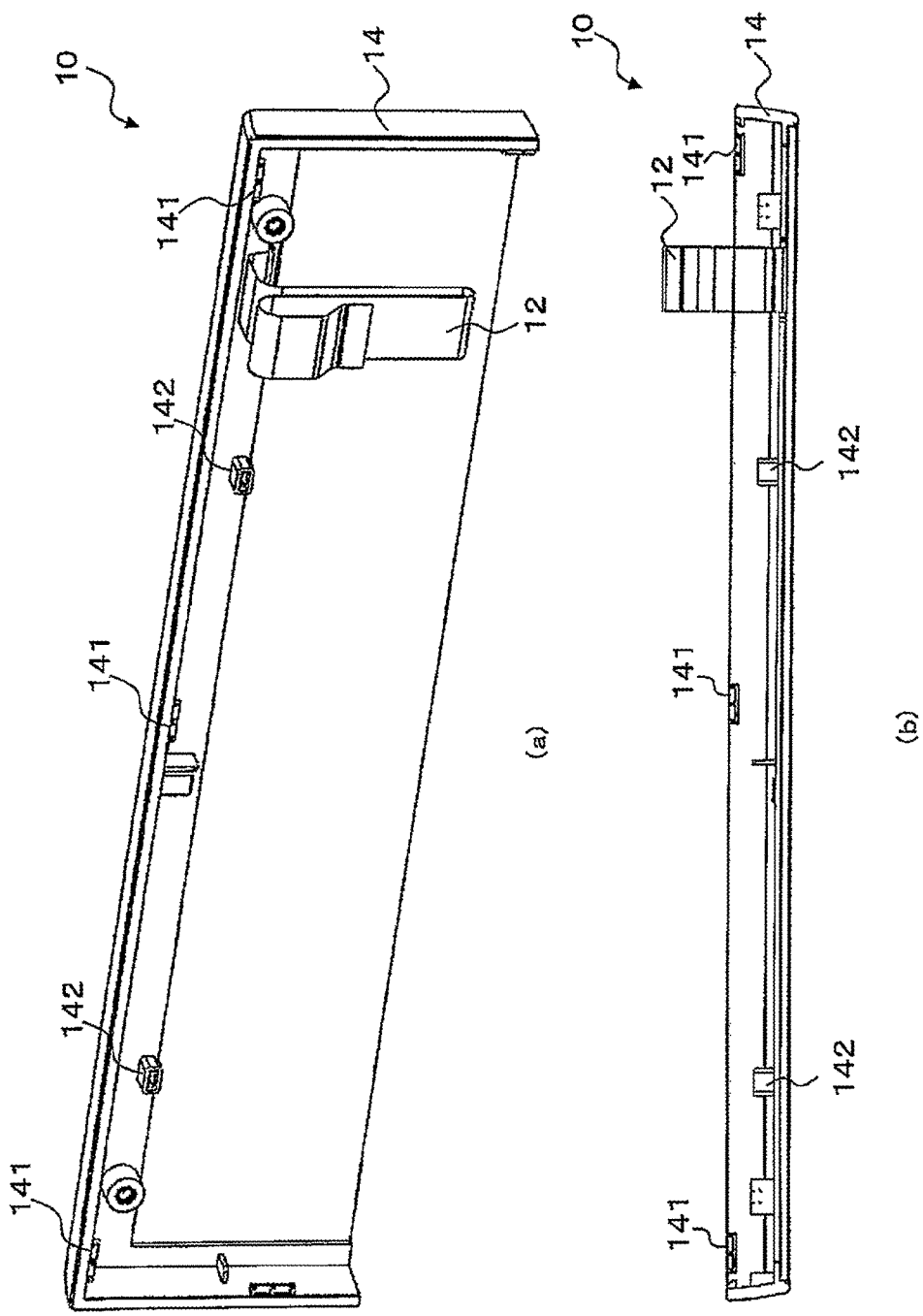
FIG. 4 includes views of the front case illustrated in FIG. 3 that is cut along the line A-A, in which (a) is a perspective view and (b) is a bottom view.
Figure 5:
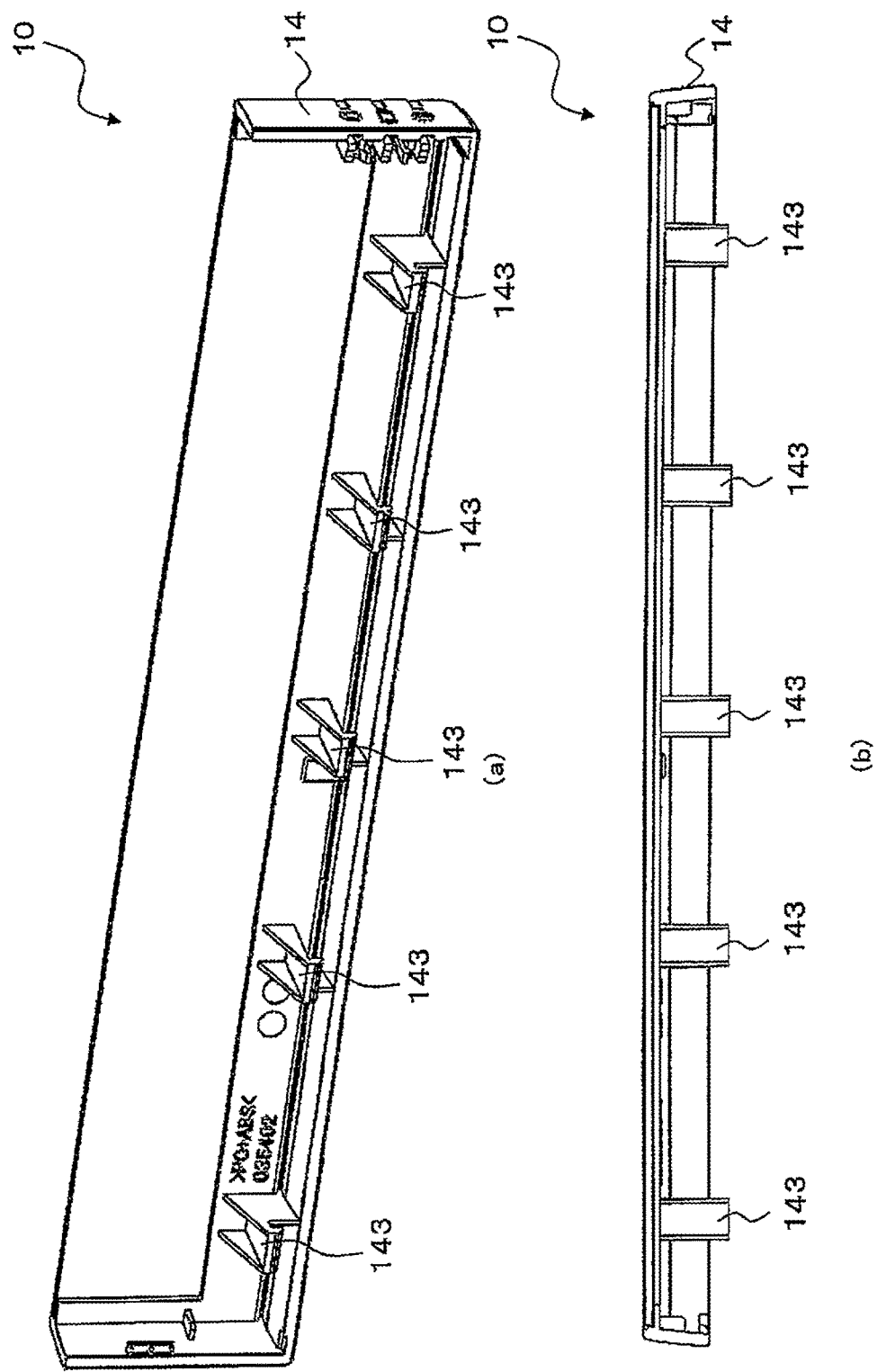
FIG. 5 includes views of the front case illustrated in FIG. 3 that is cut along the line B-B, in which (a) is a perspective view and (b) is a top view.

The front case 10 of the display device 2 is described with reference to FIG. 2 to FIG. 7. FIG. 2(a) is a perspective view of the front case 10 of the display device 2 illustrated in FIG. 1, as seen from the front side. FIG. 2(b) is an exploded perspective view in which the front case 10 of FIG. 2(a) is disassembled. As illustrated in FIG. 2, the front case 10 includes the touch panel 11, a connection cable 12, which is mounted to the touch panel 11, pieces of double-side coated tape 13, and a front bezel 14. FIG. 3(a) is a perspective view of the front case 10, as seen from the reverse side. FIG. 3(b) is an exploded perspective view of the front case 10 of FIG. 3(a).

The touch panel 11 has a plate-like shape with a thickness of several millimeters, and is electrically connected to the control unit configured to control the electronic device and to other built-in components via the connection cable 12. The touch panel 11 is fixed to the front bezel 14 with the use of the double-side coated tape 13. The front bezel 14 is provided in a frame shape (a picture frame shape), and an opening in the center of the front bezel 14 exposes the display unit 26 (see FIG. 8) to the outside. In this embodiment, the touch panel 11 is mounted to the front side of the front bezel 14. However, the touch panel 11 may be mounted to the reverse side of the front bezel 14 and exposed through the opening in the front bezel 14. On the reverse side of the front bezel 14 of the front case 10, there are provided, for example, engagement protrusions 141 and protruding portions 142, which are described later.

FIG. 4(a) is a view of the front case 10 illustrated in FIG. 2 and FIG. 3 that is cut along the line A-A. FIG. 4(b) is a bottom view of the front case 10 of FIG. 4(a). Three engagement protrusions 141 are formed along an inner peripheral edge of a top portion of the front case 10. Two protruding portions 142 are formed on the inner side of the top portion of the front case 10.

Figure 10:
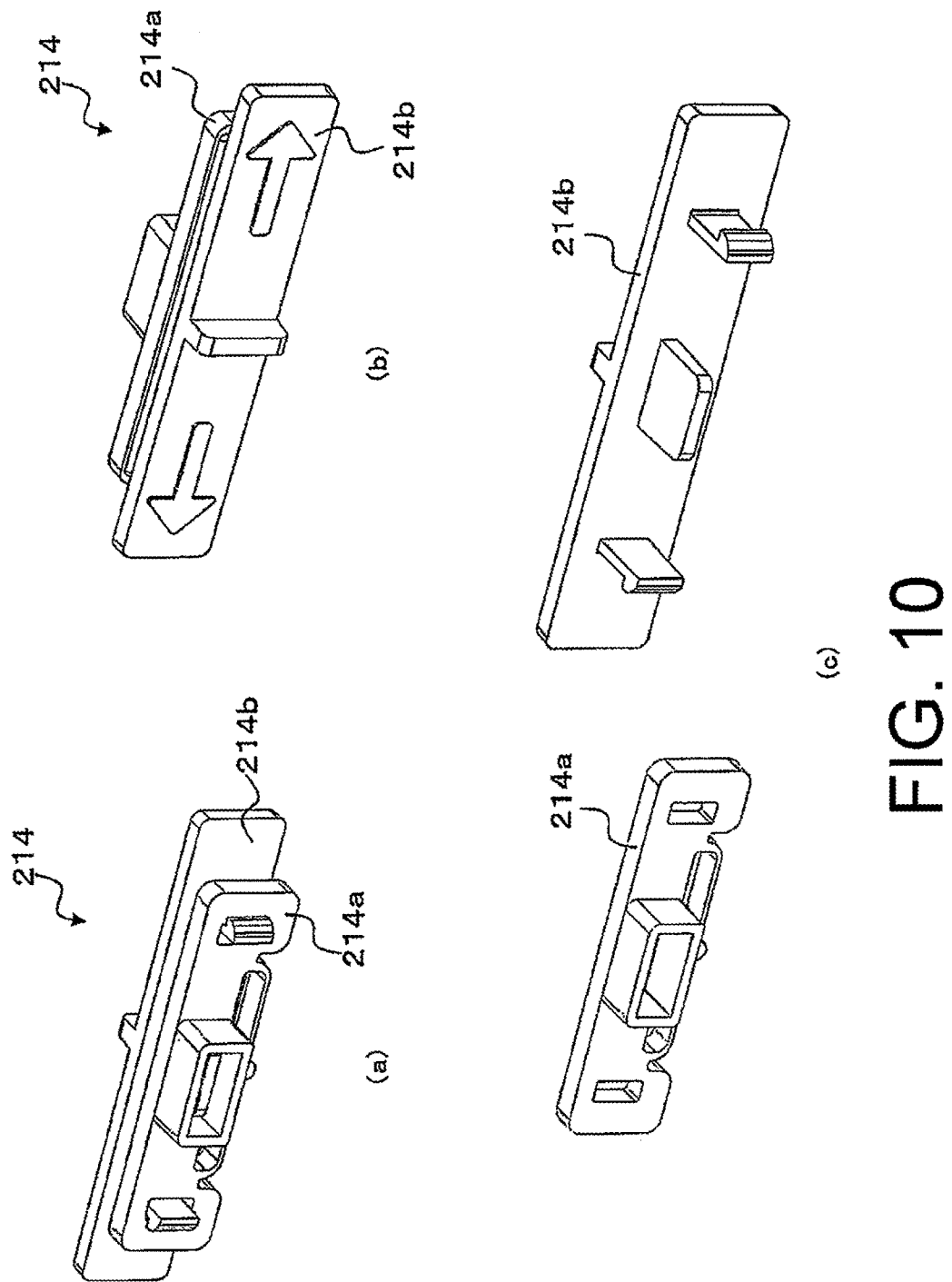
FIG. 10 includes views of a lock lever that is mounted to the rear case illustrated in FIG. 9, in which (a) is a perspective view as seen from the front side, (b) is a perspective view as seen from the reverse side, and (c) is an exploded perspective view.

When the front case 10 is to be mounted to the rear case 20, the engagement protrusions 141 are engaged with engagement recessed portions 211 formed in the rear case 20. The protruding portions 142 and lock levers 214 (FIG. 10) are at least partially overlapped with each other in the vertical direction when the lock levers 214 move from a first position (an unlocking position) to a second position (a locking position), thereby regulating the upward movement of the front case 10. Specifically, the protruding portions 142 are positioned below a part of the lock levers 214.

FIG. 5(a) is a view of the front case 10 illustrated in FIG. 2 and FIG. 3 that is cut along the line B-B. FIG. 5(b) is a top view of the front case 10 of FIG. 5(a). Five engagement protrusions 143 are formed along an inner peripheral edge of a bottom portion of the front case 10. When the front case 10 is to be mounted to the rear case 20, the engagement protrusions 143 are engaged with engagement recessed portions 213 (FIG. 9A) formed in the rear case 20.

Figure 6:
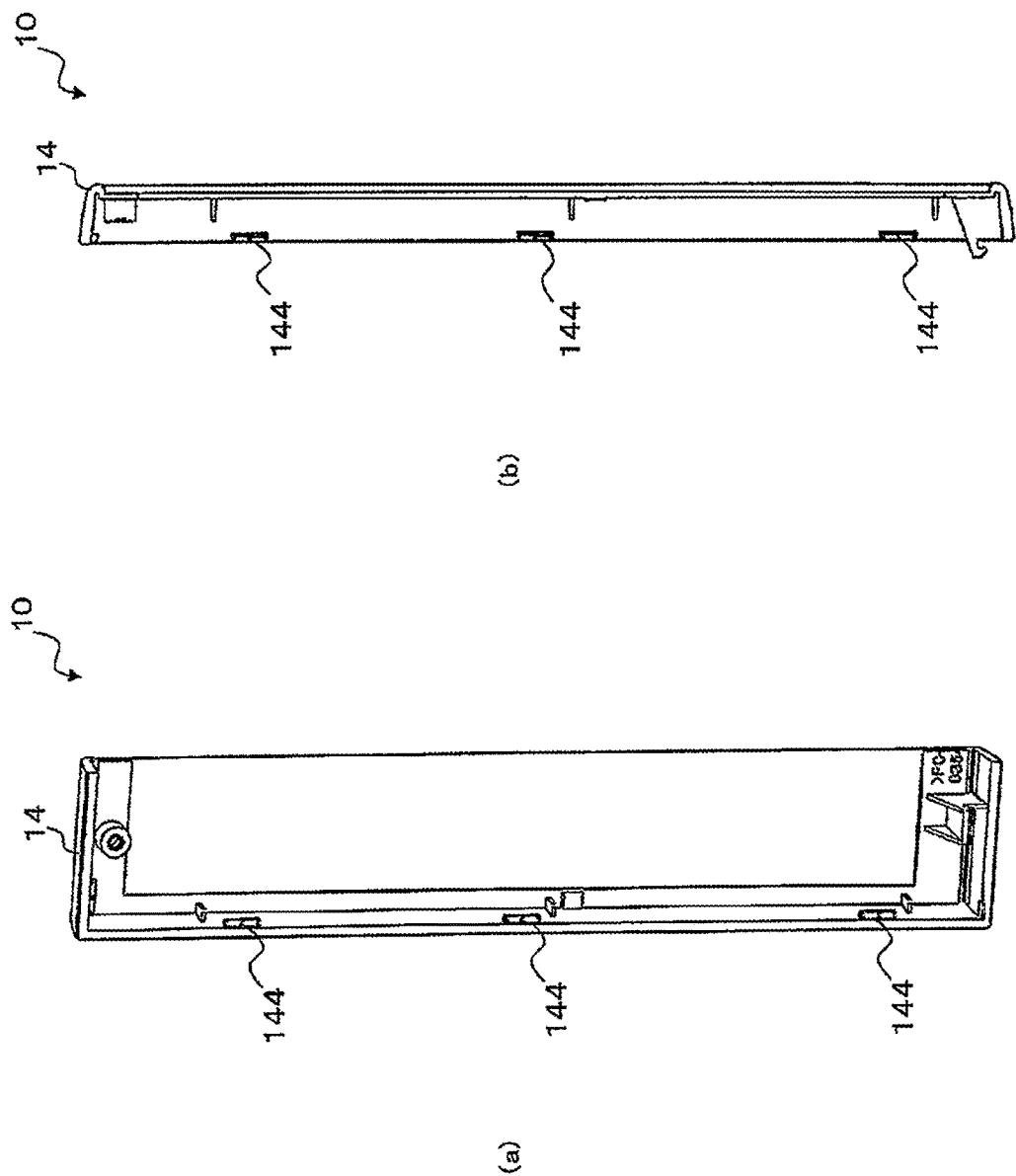
FIG. 6 includes views of the front case illustrated in FIG. 3 that is cut along the line C-C, in which (a) is a perspective view and (b) is a side view.
Figure 7:
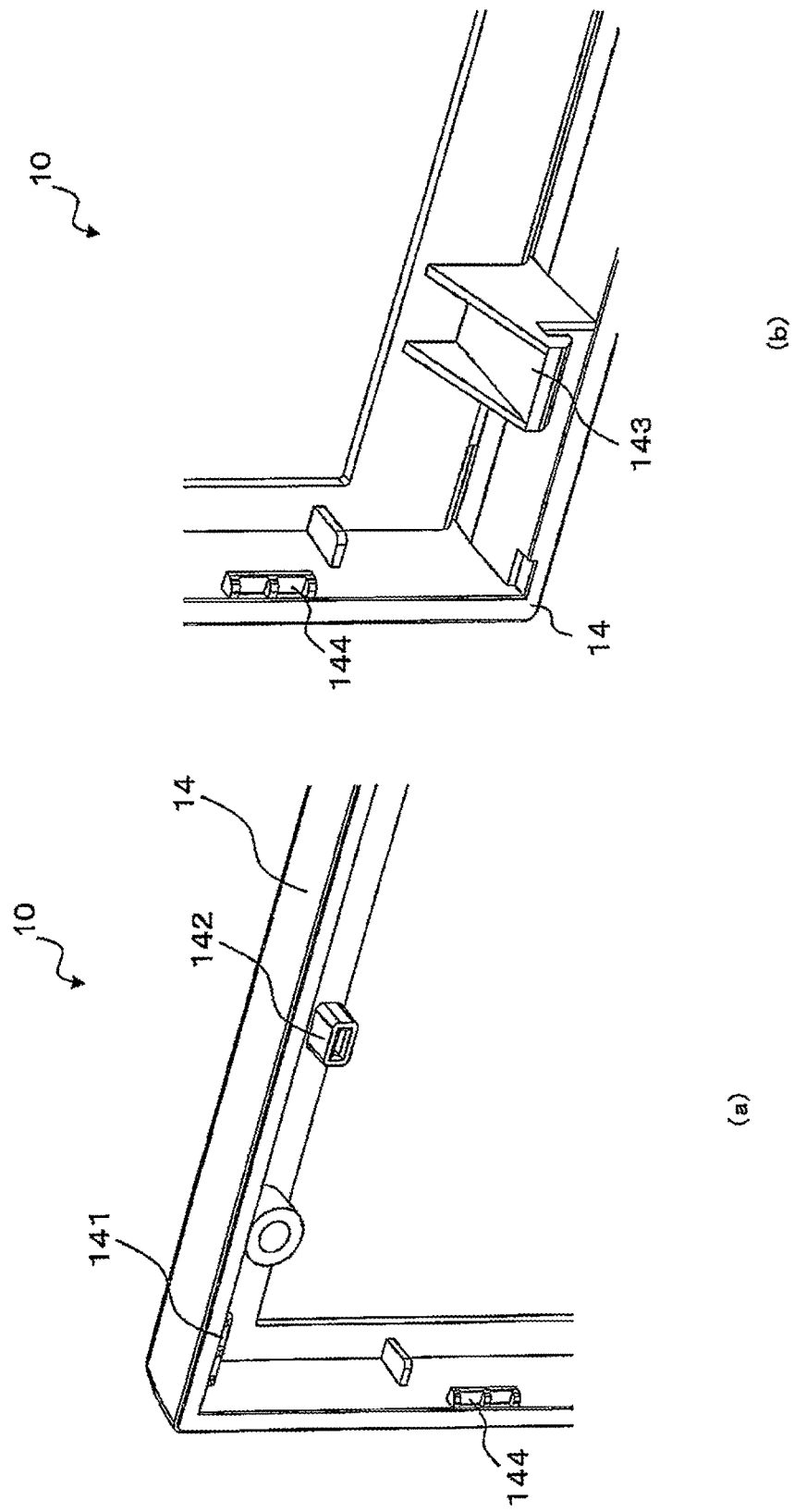
FIG. 7 includes partially enlarged views of the front case illustrated in FIG. 3, in which (a) is an enlarged view of an upper left portion and (b) is an enlarged view of a lower left portion.

FIG. 6(a) is a view of the front case 10 illustrated in FIG. 2 and FIG. 3 that is cut along the line C-C. FIG. 6(b) is a bottom view of the front case 10 of FIG. 6(a). Three engagement protrusions 144 are formed along an inner peripheral edge of a side portion of the front case 10. One side portion of the front case 10 is illustrated in the example of FIG. 6, and three engagement protrusions 144 are formed also along an inner peripheral edge of the other side portion. Six engagement protrusions 144 in total are formed along the inner peripheral edges of the side portion on the left and the side portion on the right. When the front case 10 is to be mounted to the rear case 20, the engagement protrusions 144 are engaged with guide grooves 212 (FIG. 9A) formed in the rear case 20.

FIG. 7(a) is a partially enlarged view of an upper left portion of the front case 10 illustrated in FIG. 2 and FIG. 3. FIG. 7(b) is a partially enlarged view of a lower left portion of the front case 10 of FIG. 7(a). As described above, the front case 10 has the engagement protrusions 141 along the inner peripheral edge in the top portion, the engagement protrusions 143 along the inner peripheral edge in the bottom portion, the engagement protrusions 144 along the inner peripheral edges in the side portions, and the protruding portions 142 on the inner side of the top portion. The engagement protrusions 141, 143, and 144 are fixed by engaging with their corresponding engagement recessed portions 211 and 213 and guide grooves 212 in the rear case 20, and the front case 10 can be removed easily without requiring a special tool.

Figure 13:
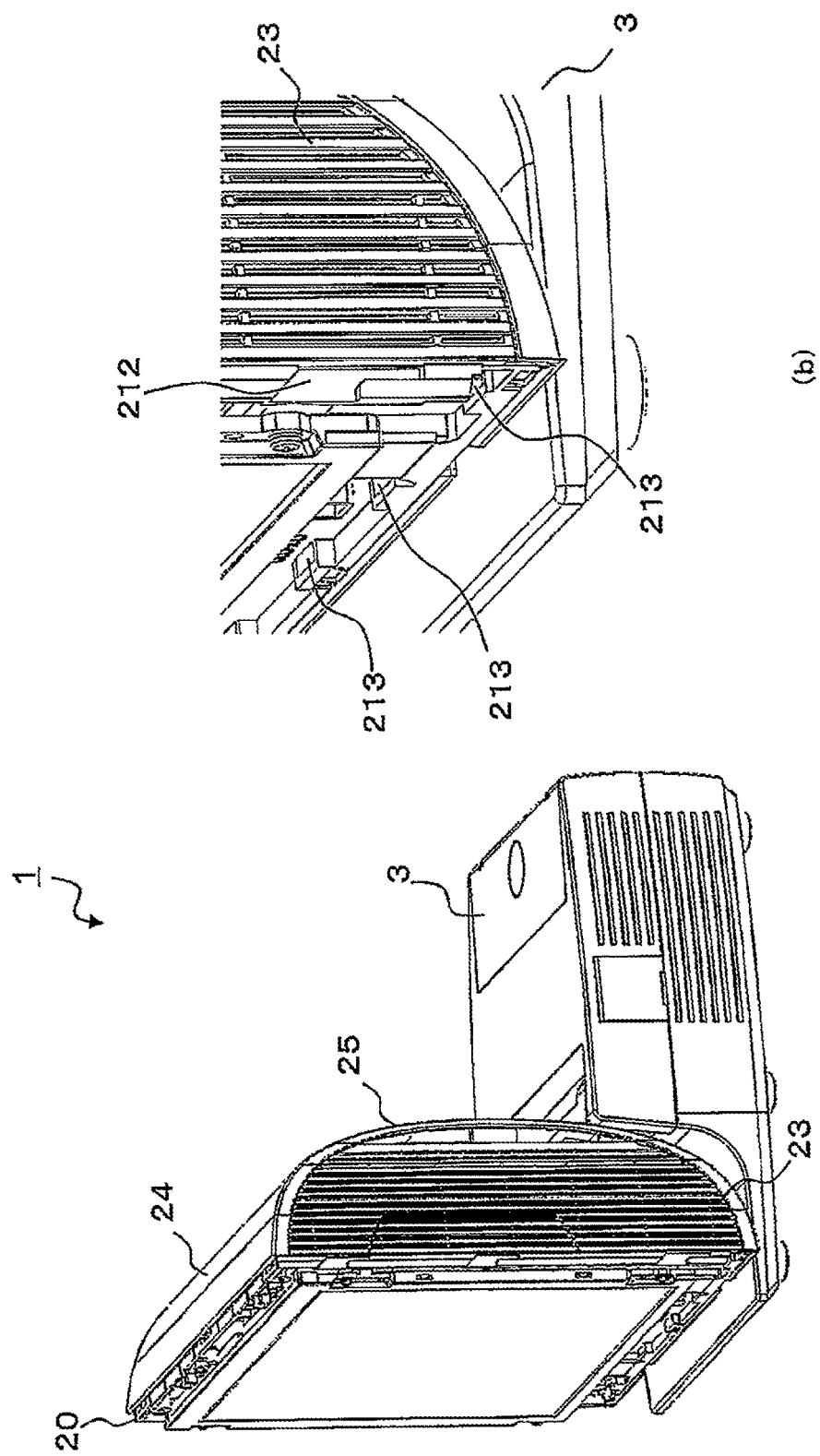
FIG. 13 includes views of the display device illustrated in FIG. 8 as seen from different angles, in which (a) is a perspective view and (b) is a partially enlarged view.

Next, the rear case 20 of the display device 2 is described with reference to FIG. 8 to FIG. 10, and FIG. 13 and FIG. 14. FIG. 8 is a perspective view for illustrating a state in which the front case 10 is removed from the display device 2 illustrated in FIG. 1(a). In FIG. 8, the display unit 26 provided in the rear case 20 is uncovered. At the time of maintenance, the front case 10 is removed from the display device 2 so that replacement or other work for the touch panel 11 and the display unit 26 can easily be performed. FIG. 13 and FIG. 14 are views of the display device 2 illustrated in FIG. 8 as seen from different angles. FIG. 13(a) is a side perspective view, and FIG. 13(b) is a partially enlarged view of FIG. 13(a). FIG. 14(a) is a top perspective view, and FIG. 14(b) is a partially enlarged view of FIG. 14(a). The guide grooves 212 formed in the sides of the rear case 20 are extended downward as illustrated in FIG. 13 and FIG. 14.

Under the state in which the front case 10 is removed from the display device 2, the interior of the rear case 20, which is a part of the display device 2, is exposed. The rear case 20 includes an outer frame 21 and an inner frame 22, which are described later. The outer frame 21 and the inner frame 22 are provided with the engagement recessed portions 211, the guide grooves 212, the engagement recessed portions 213, and the lock levers (locking means, lock units) 214. The side covers 23, the top cover 24, and the rear cover 25 are removably mounted to the outer side of the rear case 20.

Figure 9A:
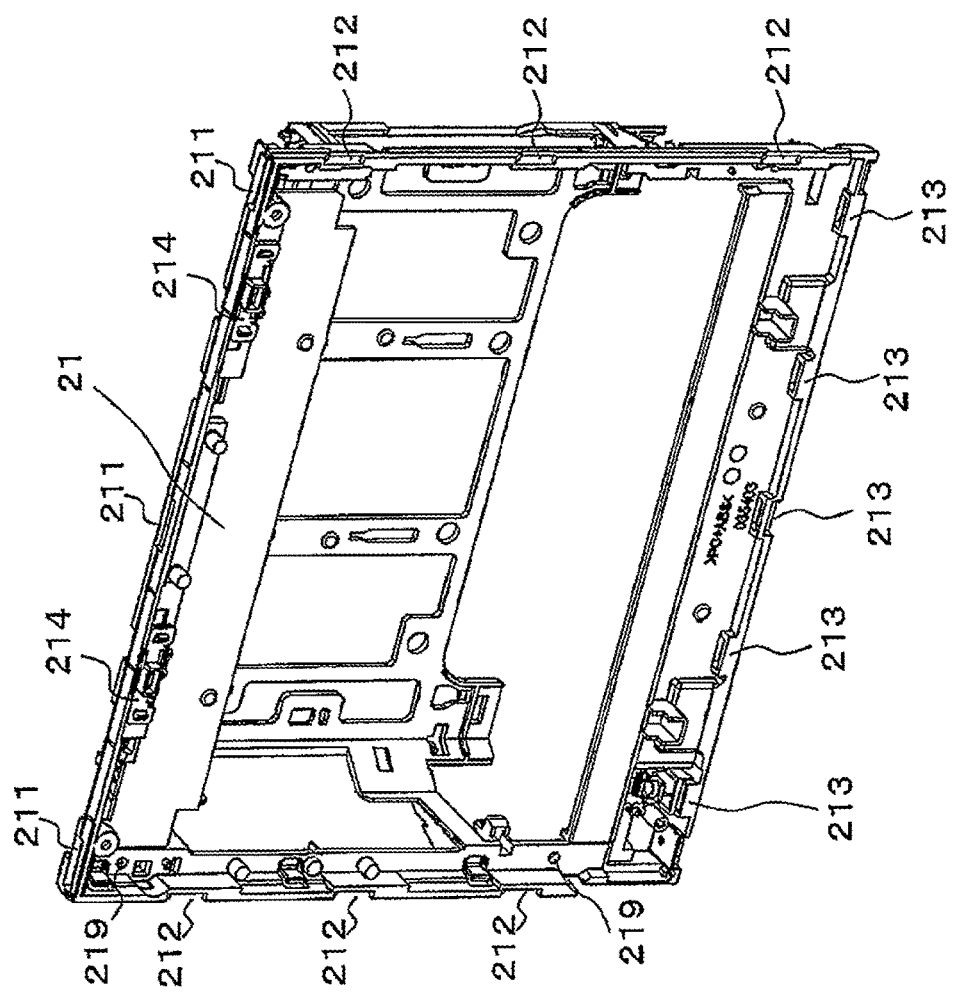
FIG. 9A is a perspective view of an outer frame that is provided in a rear case of the display device illustrated in FIG. 8, as seen from the front side.
Figure 9B:
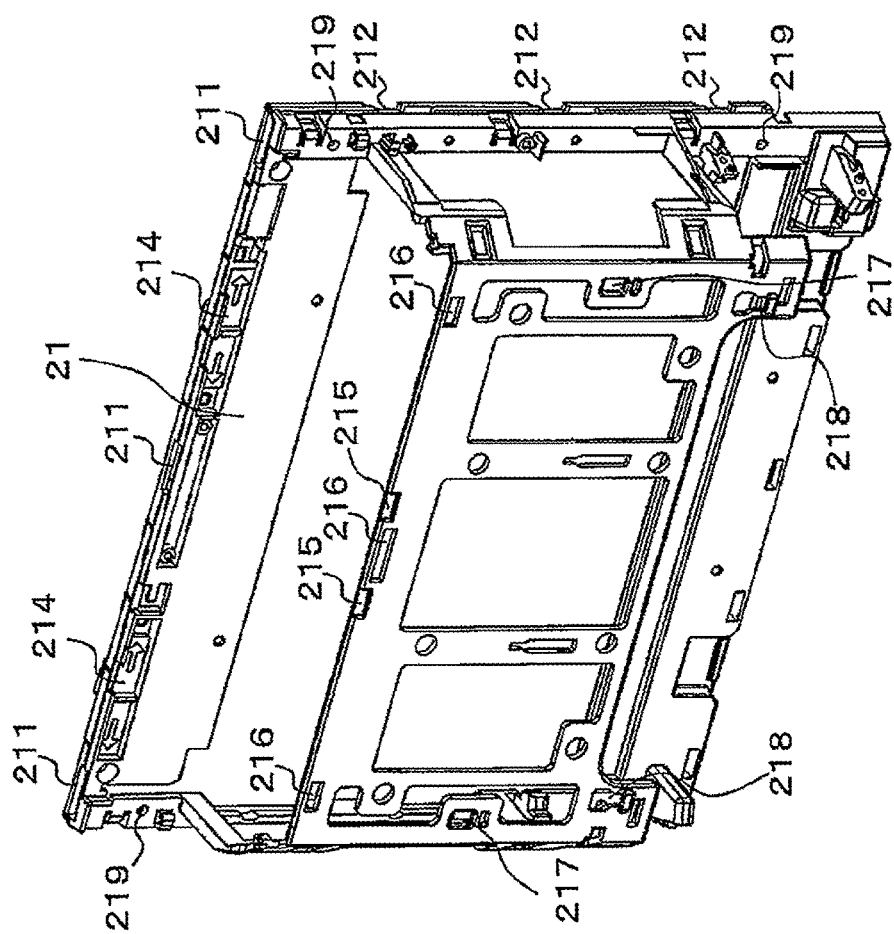
FIG. 9B is a perspective view of the outer frame that is provided in the rear case of the display device illustrated in FIG. 8, as seen from the reverse side.

FIG. 9A is a perspective view of the outer frame 21 that is provided in the rear case 20 illustrated in FIG. 8, as seen from the front side. FIG. 9B is a perspective view of the outer frame 21, as seen from the reverse side. The outer frame 21 is a molded product made of resin. Three engagement recessed portions 211 corresponding to the engagement protrusions 141 of the front case 10 are formed in a top outer peripheral edge portion of the outer frame 21. Five engagement recessed portions 213 corresponding to the engagement protrusions 143 of the front case 10 are formed in a bottom outer peripheral edge portion of the outer frame 21. Three guide grooves 212 corresponding to the engagement protrusions 144 of the front case 10 are formed in each of side outer peripheral edge portions of the outer frame 21 on the right and on the left.

An upper side of the outer frame 21 has two hollow portions, and one lock lever 214 is provided in each of the hollow portions. When the lock levers 214 are at the first position (unlocking position), the protruding portions 142 formed in the front case 10 do not obstruct the motion of removing the front case 10 from the rear case 20. When the lock levers 214 are at the second position (locking position), the lock levers 214 move to positions above the protruding portions 142, and hence the upward movement of the front case 10 is regulated, thereby regulating the motion of removing the front case 10 from the rear case 20. In short, the front case 10 cannot be removed from the rear case 20 in a locked state.

On the reverse side of the outer frame 21, there are formed top cover positioning recessed portions 215 and top cover engagement holes 216. The top cover positioning recessed portions 215 are engaged with first positioning protrusions 245 of the top cover 24 (FIG. 11). The top cover engagement holes 216 are engaged with engagement claws 243 of the top cover 24. Moreover, there are also formed rear cover protruding portion contact positions 217 and rear cover engagement holes 218. The rear cover protruding portion contact positions 217 are engaged with protruding portions 252 of the rear cover 25. The rear cover engagement holes 218 are engaged with engagement protrusions 253 of the rear cover 25.

Figure 9C:
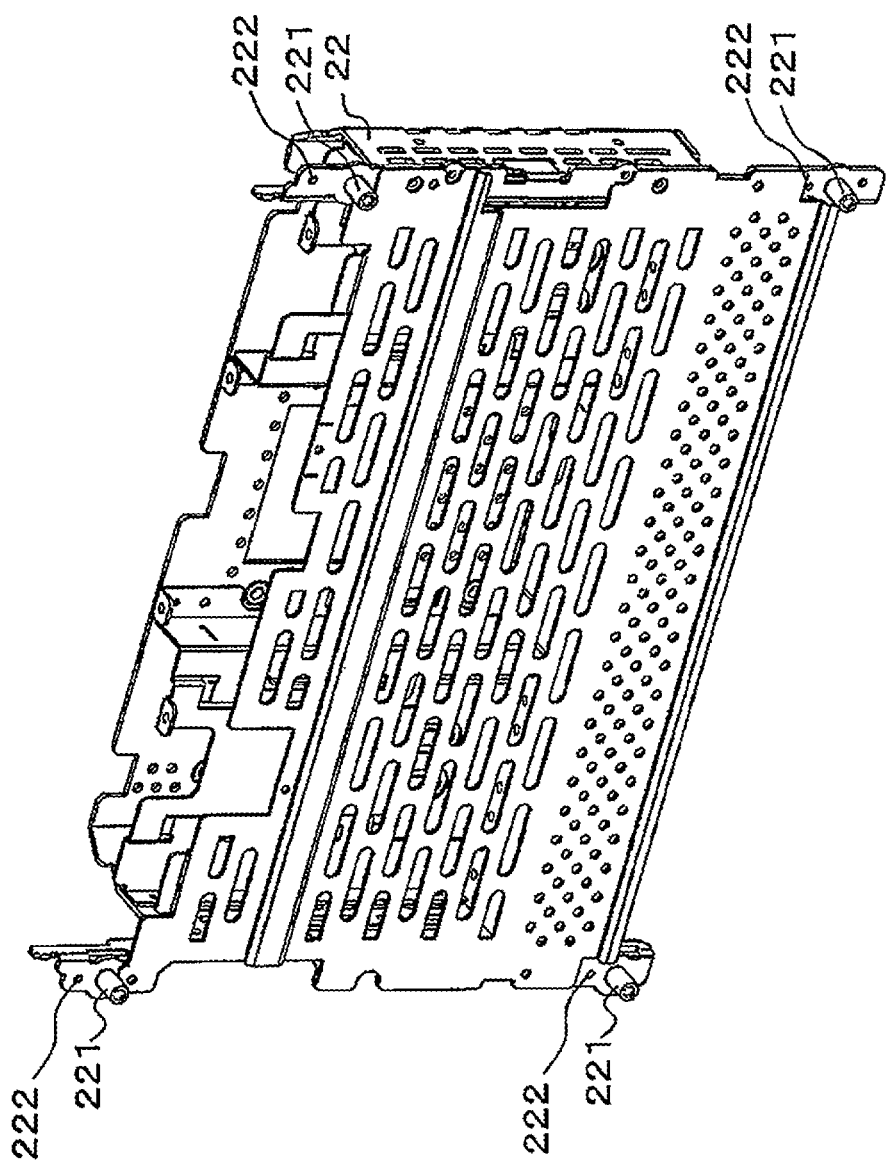
FIG. 9C is a perspective view of an inner frame that is provided in the rear case of the display device illustrated in FIG. 8, as seen from the front side.
Figure 9D:
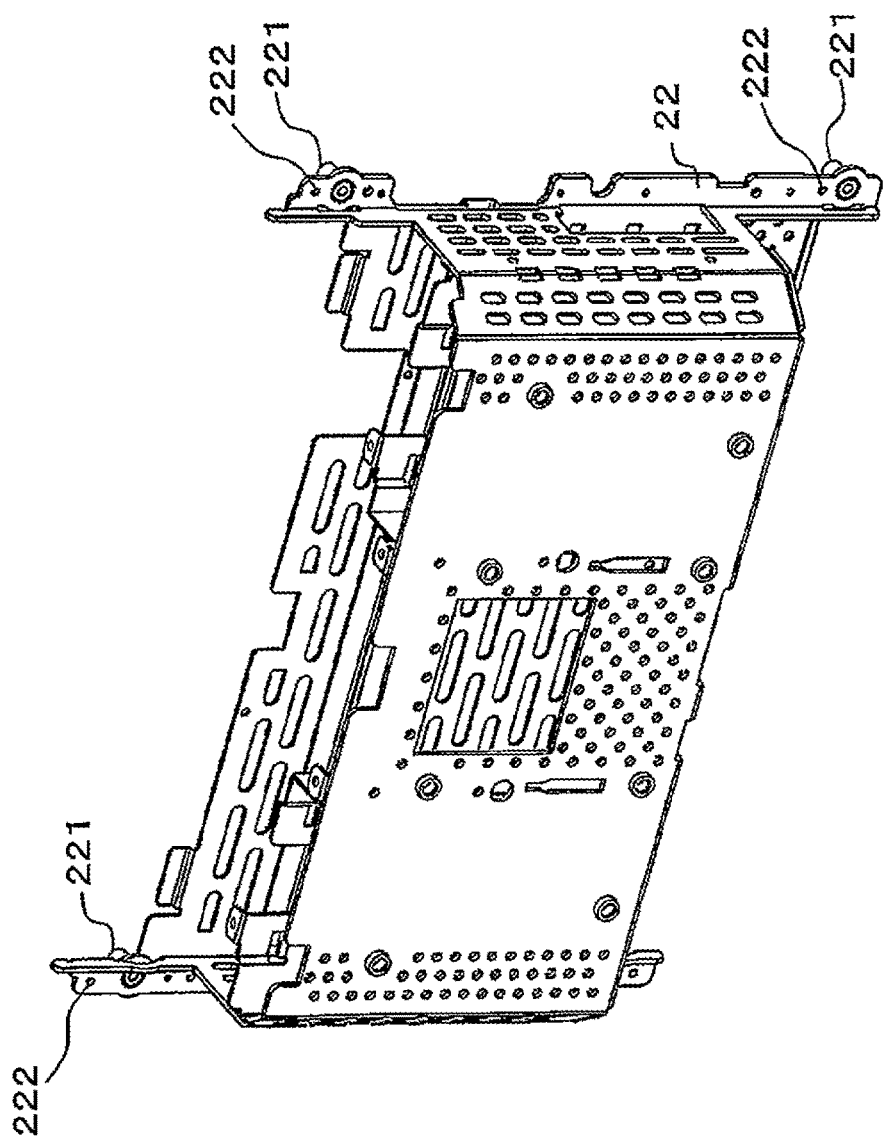
FIG. 9D is a perspective view of the inner frame that is provided in the rear case of the display device illustrated in FIG. 8, as seen from the reverse side.
Figure 9E:
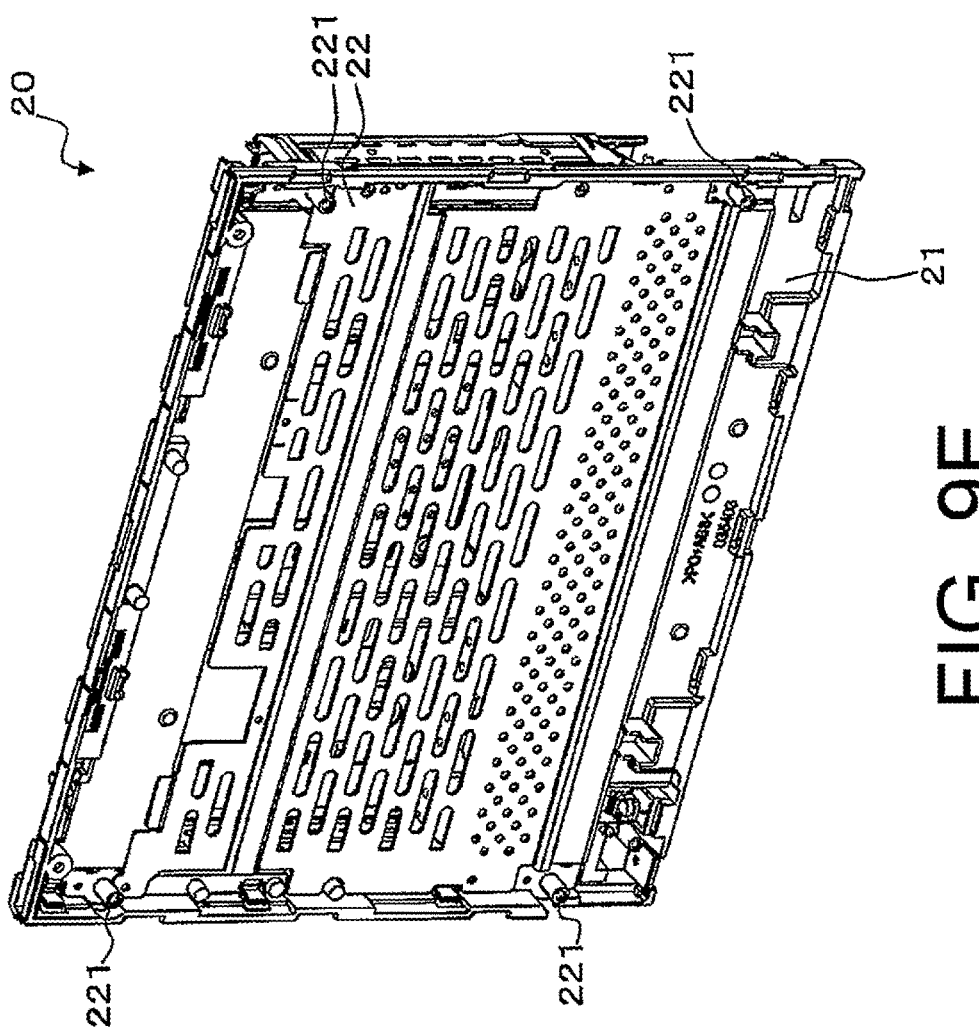
FIG. 9E is a perspective view of the outer frame with the inner frame placed inside, as seen from the front side.
Figure 9F:
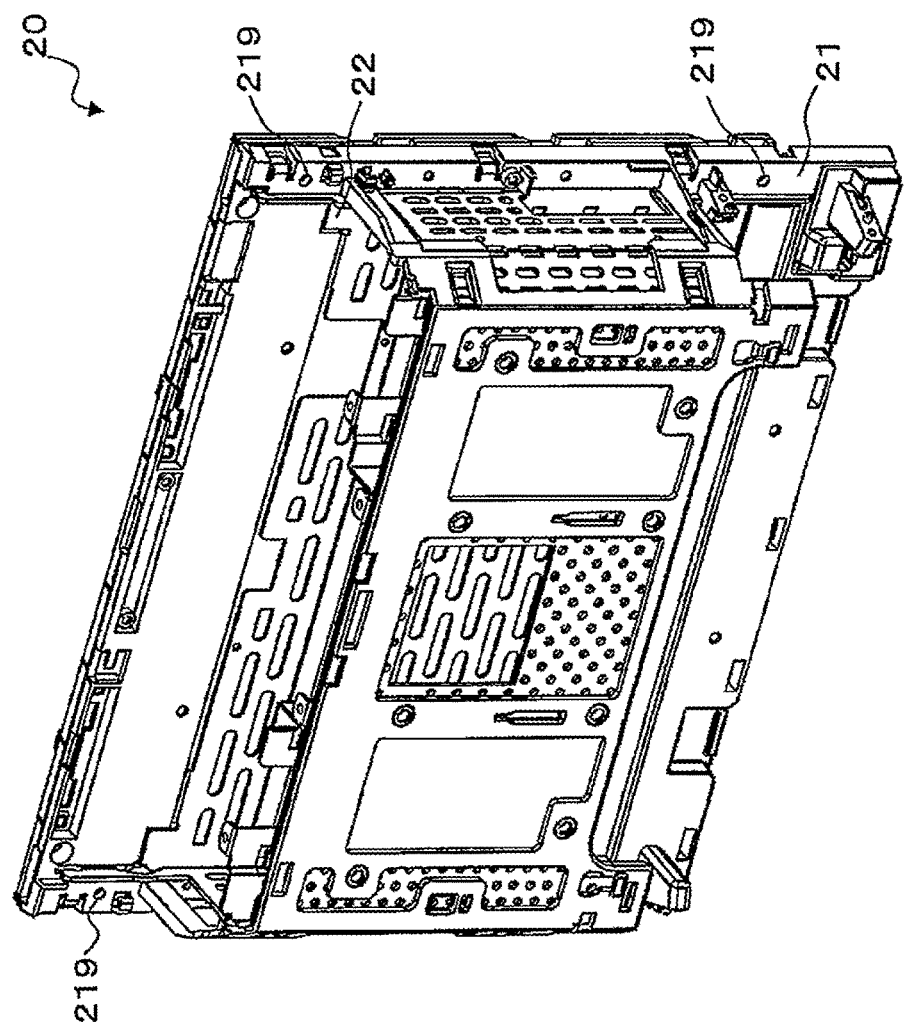
FIG. 9F is a perspective view of the outer frame with the inner frame placed inside, as seen from the reverse side.

FIG. 9C is a perspective view of the inner frame 22 that is provided in the rear case 20 of the display device illustrated in FIG. 8, as seen from the front side. FIG. 9D is a perspective view of the inner frame 22 illustrated in FIG. 8, as seen from reverse side. The inner frame 22 is a frame obtained by combining a plurality of bent metal plates. FIG. 9E is a perspective view of the outer frame 21 with the inner frame 22 housed inside, as seen from the front side. FIG. 9F is a perspective view of the outer frame 21 with the inner frame 22 housed inside, as seen from the reverse side. The outer frame 21 housing the inner frame 22 inside is screwed at four locations, while placing four screw holes 222, which are formed in the infer frame 22, and four screwing holes 219, which are formed in the outer frame 21, in flush with each other. The display unit 26 is mounted to this by using screws in four screwing protrusions 221 having screw holes. The side covers 23, the top cover 24, and the rear cover 25 are then removably mounted. The control unit and others are built in the infer frame 22. The display device 2 is completed by mounting the front case 10 to the thus assembled rear case 20.

FIG. 10(a) is a perspective view of the lock lever 214 provided in the outer frame 21 that is illustrated in FIG. 9, as seen from the front side. FIG. 10(b) is a perspective view of the lock lever 214 as seen from the reverse side. FIG. 10(c) is an exploded perspective view of the lock lever 214. The lock lever 214 includes a lock lever regulation portion 214a and a lock lever operation portion 214b. The lock lever operation portion 214b is obtained by providing engagement claws, a protruding portion, and the like on a rectangular plate-shaped member. On the front side of the lock lever operation portion 214b, engagement claws engaged with holes formed in the lock lever regulation portion 214a are formed in two locations, and a protruding portion inserted in a hollow protrusion formed in the lock lever regulation portion 214a is formed. On the reverse side of the lock lever operation portion 214b, a knob portion used to move the lock lever 214 between the first position and the second position, and guide markings in the form of arrows are formed.

The lock lever regulation portion 214a is obtained by providing holes that correspond to engagement claws and a protrusion to a rectangular plate-shaped member. Holes corresponding to the engagement claws of the lock lever operation portion 214b are formed in two locations, and a hollow protrusion is formed at the center. At the time of maintenance of the touch panel 11 or other components, the front case 10 is unlocked by moving the lock lever 214 from the second position to the first position following the guide markings that are formed on the lock lever operation portion 214b, thereby being capable of removing the front case 10 from the rear case 20. After the maintenance is finished, the front case 10 is locked by moving the lock lever 214 from the first position to the second position following the guide markings, and hence the front case 10 can no longer be removed from the rear case 20.

Figure 11A:
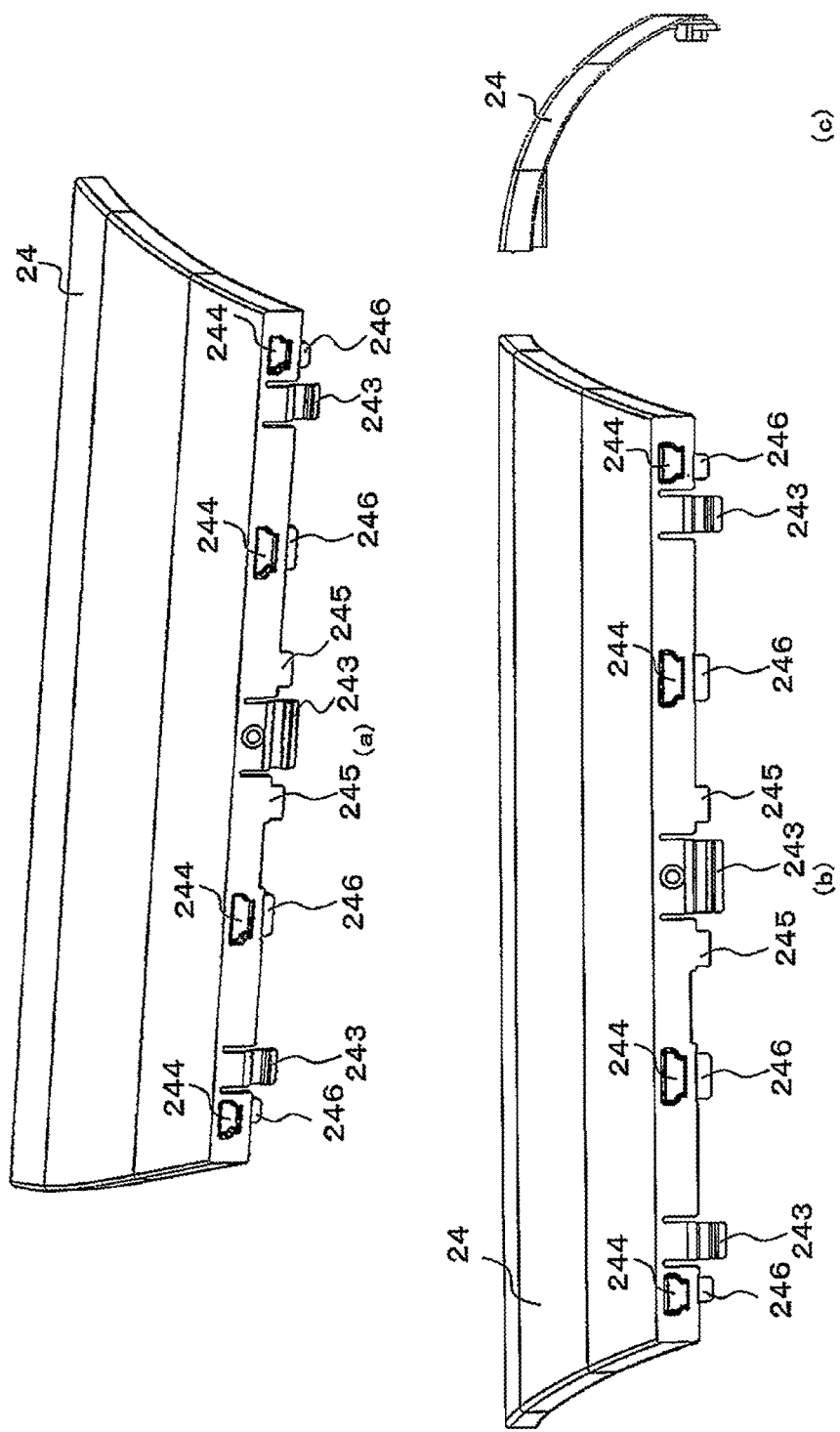
FIG. 11A includes views of a top cover that is mounted to the rear case of the display device according to the embodiment of this invention, in which (a) is a perspective view, (b) is a front view as seen from a front side, and (c) is a side view.
Figure 11B:
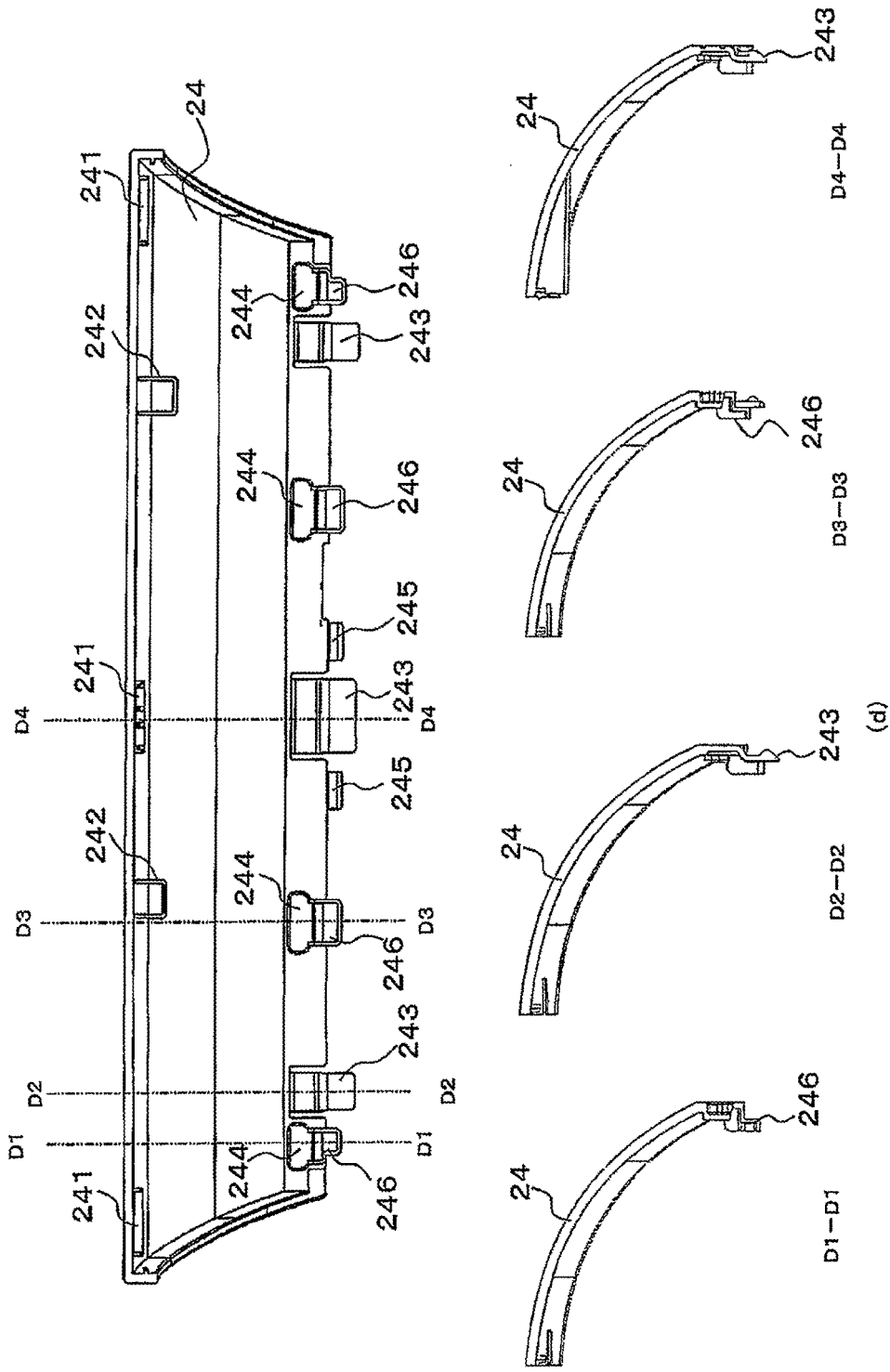
FIG. 11B includes views of the top cover that is mounted to the rear case of the display device according to the embodiment of this invention, in which (d) includes a front view as seen from a reverse side and sectional views taken at four locations in the top cover.

Next, the top cover 24 mounted to the display device 2 is described with reference to FIG. 11A and FIG. 11B. FIG. 11A(a) is a perspective view of the top cover 24 that is mounted to the display device 2 according to this embodiment. FIG. 11A(b) is a front view of the top cover 24 as seen from the front side. FIG. 11A(c) is a side view of the top cover 24. FIG. 11B(d) includes a front view of the top cover 24 as seen from the reverse side, and sectional views taken at four locations in the top cover 24. Three engagement protrusions 241 and two protruding portions 242 are formed in an upper portion of the top cover 24. When the top cover 24 is to be mounted to the rear case 20, the engagement protrusions 241 are engaged with the engagement recessed portions 211 formed in the rear case 20. When the lock levers 214 are at the first position (unlocking position), the protruding portions 242 are brought into abutment against the knob portions of the lock levers 214 to thereby prevent the top cover 24 from being mounted.

Three engagement claws 243, four engagement holes 244, two first positioning protrusions 245, and four second positioning protrusions 246 are formed in a lower portion of the top cover 24. When the top cover 24 is to be mounted to the rear case 20, the engagement claws 243 are engaged with the top cover engagement holes 216 formed in the outer frame 21 of the rear case 20. The first positioning protrusions 245 are brought into contact with the top cover positioning recessed portions 215 formed in the outer frame 21 of the rear case 20. The engagement holes 244 are engaged with engagement protrusions 251 of the rear cover 25. The second positioning protrusions 246 are brought into contact with the reverse side that is a side on which the top cover positioning recessed portions 215 are formed.

Figure 12A:
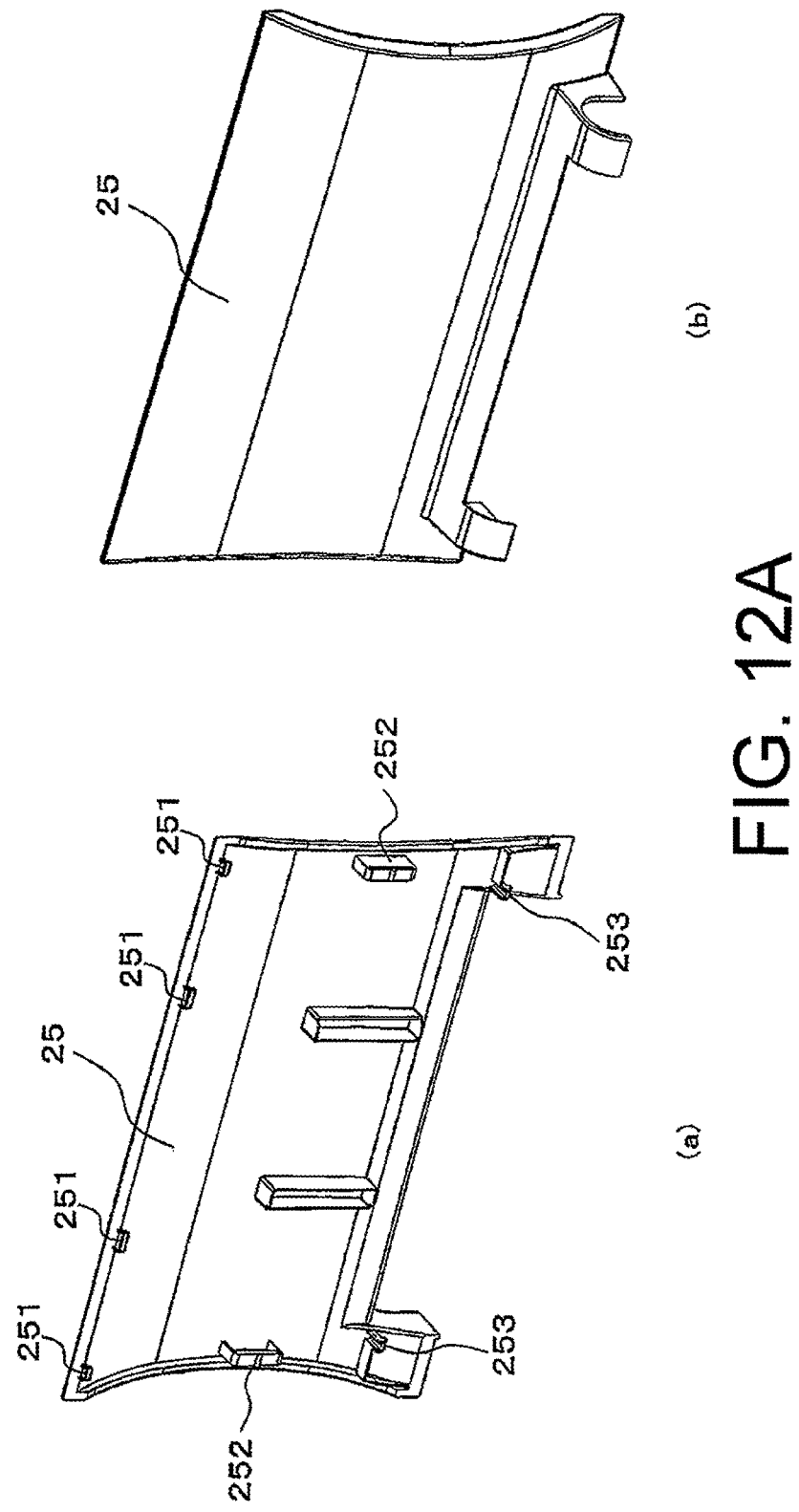
FIG. 12A includes views of a rear cover that is mounted to the rear case of the display device according to the embodiment of this invention, in which (a) is a perspective view as seen from the reverse side and (b) is a perspective view as seen from the front side.
Figure 12B:
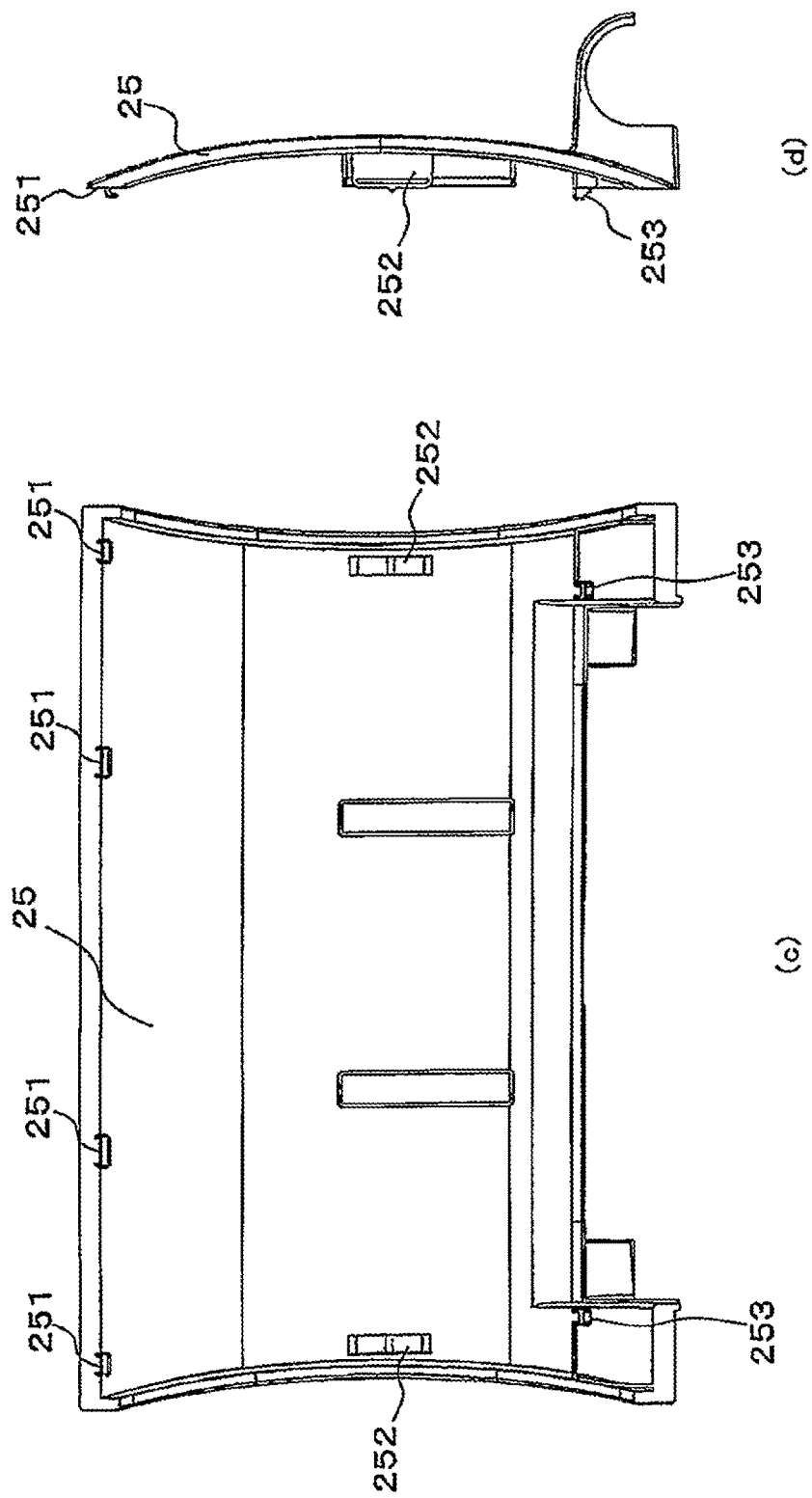
FIG. 12B includes views of the rear cover that is mounted to the rear case of the display device according to the embodiment of this invention, in which (c) is a front view and (d) is a side view.

Next, the rear cover 25 mounted to the display device 2 is described next with reference to FIG. 12A and FIG. 12B. FIG. 12A(a) is a perspective view of the rear cover 25 that is mounted to the display device 2 according to this embodiment, as seen from the reverse side. FIG. 12A(b) is a perspective view of the rear cover 25 as seen from the front side. FIG. 12B(c) is a front view of the rear cover 25. FIG. 12B(d) is a side view of the rear cover 25. On the reverse side of the rear cover 25, there are formed four engagement protrusions 251 in an upper portion, two protruding portions 252 in a middle portion, and two engagement protrusions 253 in a lower portion. When the rear cover 25 is to be mounted to the rear case 20, the protruding portions 252 are engaged with the rear cover protruding portion contact positions 217. The engagement protrusions 253 are engaged with the rear cover engagement holes 218 formed in the outer frame 21 of the rear case 20. The engagement protrusions 251 are engaged with the engagement holes 244 formed in the top cover 24.

Figure 15:
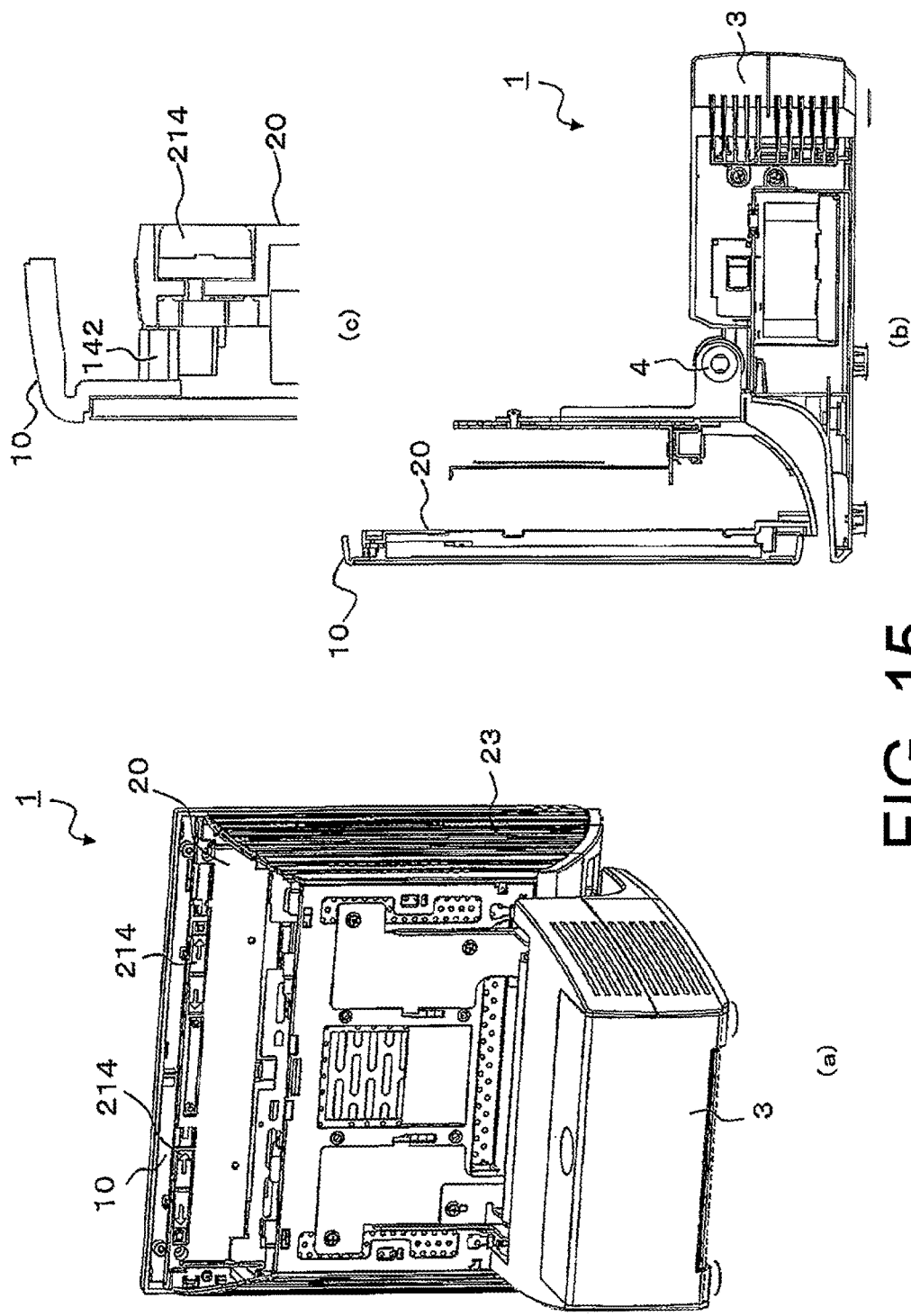
FIG. 15 includes views for illustrating a method of mounting the front case in the display device according to the embodiment of this invention, in which (a) is a perspective view as seen from the back, (b) is a sectional view around the middle, and (c) is a partially enlarged view of (b).

Next, a method of mounting the front case 10 to the rear case 20 is described with reference to FIG. 15 and FIG. 16. FIG. 15 are views for illustrating a method of mounting the front case 10 to the rear case 20 in the display device 2 according to the embodiment of this invention. FIG. 15(a) is a perspective view as seen from the back. FIG. 15(b) is a sectional view around the middle. FIG. 15(c) is a partially enlarged view of FIG. 15(b). The connection cable 12 of the touch panel 11 in the front case 10, and the control unit and other built-in components are omitted from FIG. 15 and FIG. 16 for the convenience of description.

When maintenance work is to be performed on the display device 2, a worker (user) removes the front case 10 from the rear case 20. After the maintenance work is finished, the front case 10 is mounted to the rear case 20. When the front case 10 is to be removed from the rear case 20, the rear cover 25 is removed from the rear case 20, and the top cover 24 is subsequently removed. After the lock lever 214 is moved to the first position at which the front case 10 is unlocked, the front case 10 is removed. The front case 10 is mounted to the rear case 20 by taking reverse steps. FIG. 15 are illustrations of a state in which, in order to mount the front case 10 to the rear case 20, the engagement protrusions 144, which are provided along the inner edges of the side portions of the front case 10, are inserted into the guide grooves 212, which are provided along the outer edges of the side portions of the outer frame 21 of the rear case 20, to bring the front case 10 into contact with the rear case 20.

Figure 16:
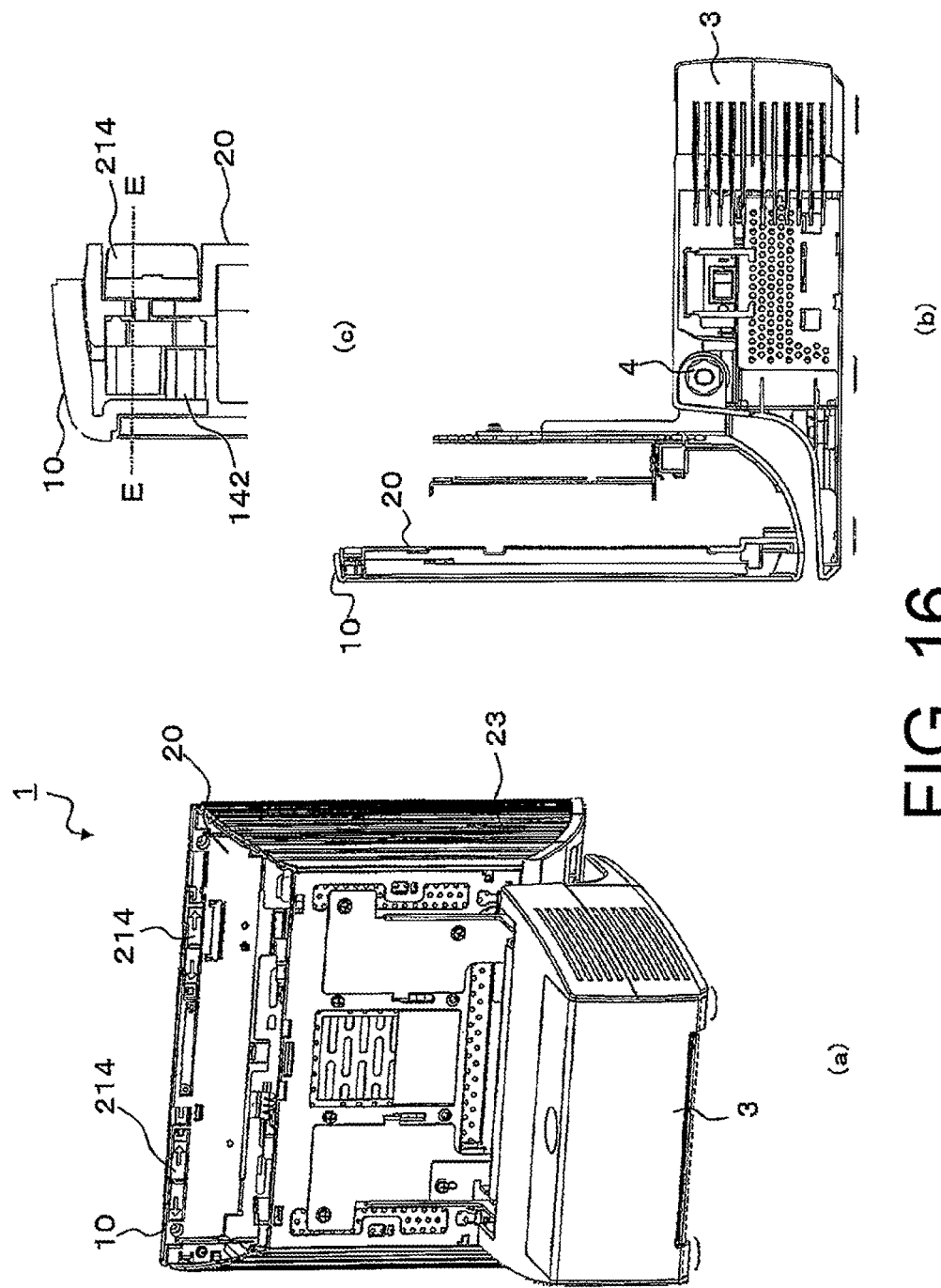
FIG. 16 includes views for illustrating a state in which the front case of the display device illustrated in FIG. 15 is pulled downward and locked, in which (a) is a perspective view as seen from the back, (b) is a sectional view of a center portion, and (c) is a partially enlarged view of FIG. 16(b).

FIG. 16 are views for illustrating a state in which the front case 10 of the display device 2 illustrated in FIG. 15 is pulled downward and locked, that is, a state in which mounting of the front case 10 to the rear case 20 has been completed. FIG. 16(a) is a perspective view of the display device 2 as seen from the back. FIG. 16(b) is a sectional view of a center portion of the display device 2. FIG. 16(c) is a partially enlarged view of FIG. 16(b). Mounting of the front case 10 to the rear case 20 is completed by moving the front case 10 in the state that is illustrated in FIG. 15 downward along the guide grooves 212, engaging the engagement portions that are provided in a plurality of locations in the front case 10 with their corresponding engagement portions that are provided in a plurality of locations in the rear case 20, and then moving the lock levers 214 to the second position, at which the front case 10 is locked.

Under the state in which mounting of the front case 10 to the rear case 20 has been completed, the engagement portions that are provided in a plurality of locations in the front case 10 are engaged with their corresponding engagement portions that are provided in a plurality of locations in the rear case 20. Specifically, the engagement protrusions 141 along the inner peripheral edge in the top portion (on the inside of the top portion) of the front case 10, the engagement protrusions 144 on the inside of the side portions of the front case 10 on the right and on the left, and the engagement protrusions 143 on the inside of the bottom portion of the front case 10 are engaged with the engagement recessed portions 211 along the top outer peripheral edge of the rear case 20, the guide grooves 212 along the side outer peripheral edges of the rear case 20 on the right and on the left, and the engagement recessed portions 213 along the bottom outer peripheral edge of the rear case 20, respectively. The lock levers 214 are positioned above the protruding portions 142, which are provided on the inside of the top portion of the front case 10, to regulate the upward movement of the front case 10 as illustrated in FIG. 16(*c*). In other words, the display device 2 of FIG. 16 is under the state in which mounting of the front case 10 to the rear case 20 has been completed. Next, the top cover 24 is mounted to the rear case 20 by bringing the top cover 24 into contact with a given location and then pulling the top cover 24 downward. Thereafter, the rear cover 25 is mounted to the rear case 20 by bringing the rear cover 25 into contact with a given location and then pulling the rear cover 25 downward. Accordingly, the display device 2 is brought into the state illustrated in FIG. 1.

The rear case 20 is removed from the front case 10 by taking reverse steps. Specifically, the rear cover 25 is removed from the rear case 20 by pulling the rear cover 25 upward, and then the top cover 24 is removed from the rear case 20 by pulling the top cover 24 upward. Thereafter, the lock levers 214 are moved to the unlocking position, and the front case 10 is pulled upward and then pulled forward to be removed from the rear case 20.

Figure 17:
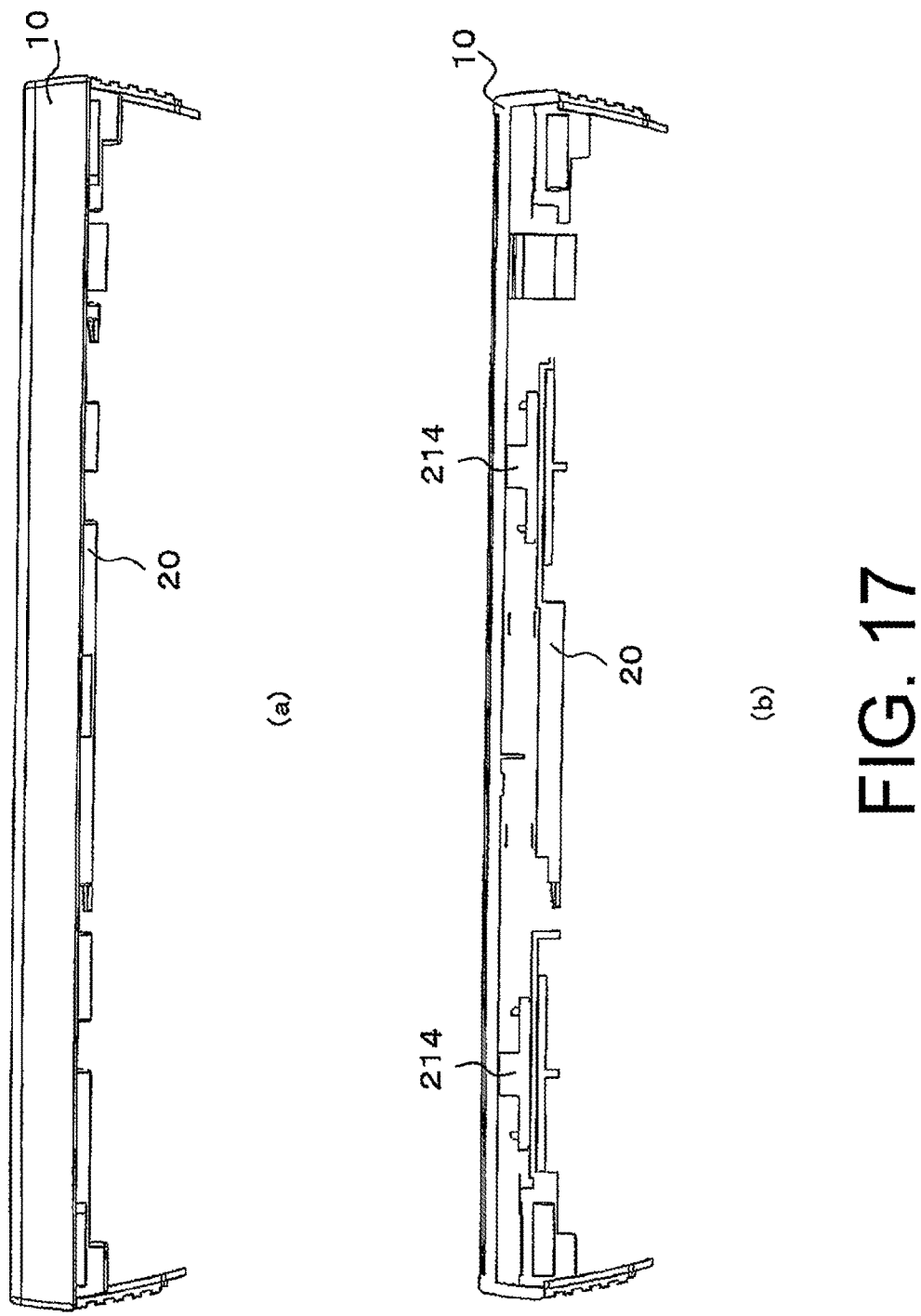
FIG. 17 includes views for illustrating a lock reminder mechanism of the display device, in which (a) is a top view and (b) is a view cut along the line E-E.

Next, a lock reminder mechanism of the display device 2 according to this embodiment is described with reference to FIG. 17 to FIG. 19. FIG. 17 are views for illustrating a state in which the front case 10 is mounted to the rear case 20, and in which the lock levers 214 have been moved to the second position. FIG. 17(*a*) is a top view. FIG. 17(*b*) is a view cut along the line E-E (see FIG. 16(*c*)). As illustrated in FIG. 17(*b*), the lock levers 214 are positioned above the protruding portions 142 of the front case 10, thereby regulating the upward movement of the front case 10. As illustrated in FIG. 17(*a*), the knob portion of the lock lever operation portion 214*b* of each lock lever 214 is contained in the outer frame 21 of the rear case 20. As for the rear case 20, only the vicinity of the lock lever 214 is illustrated.

When the lock levers 214 are not at the second position, the front case 10 may move upward to be accidentally removed from the rear case 20. In this embodiment, a worker (user) can recognize that the front case 10 and the rear case 20 are not fixed by the lock levers 214 (that the lock levers 214 are not at the second position).

Figure 18:
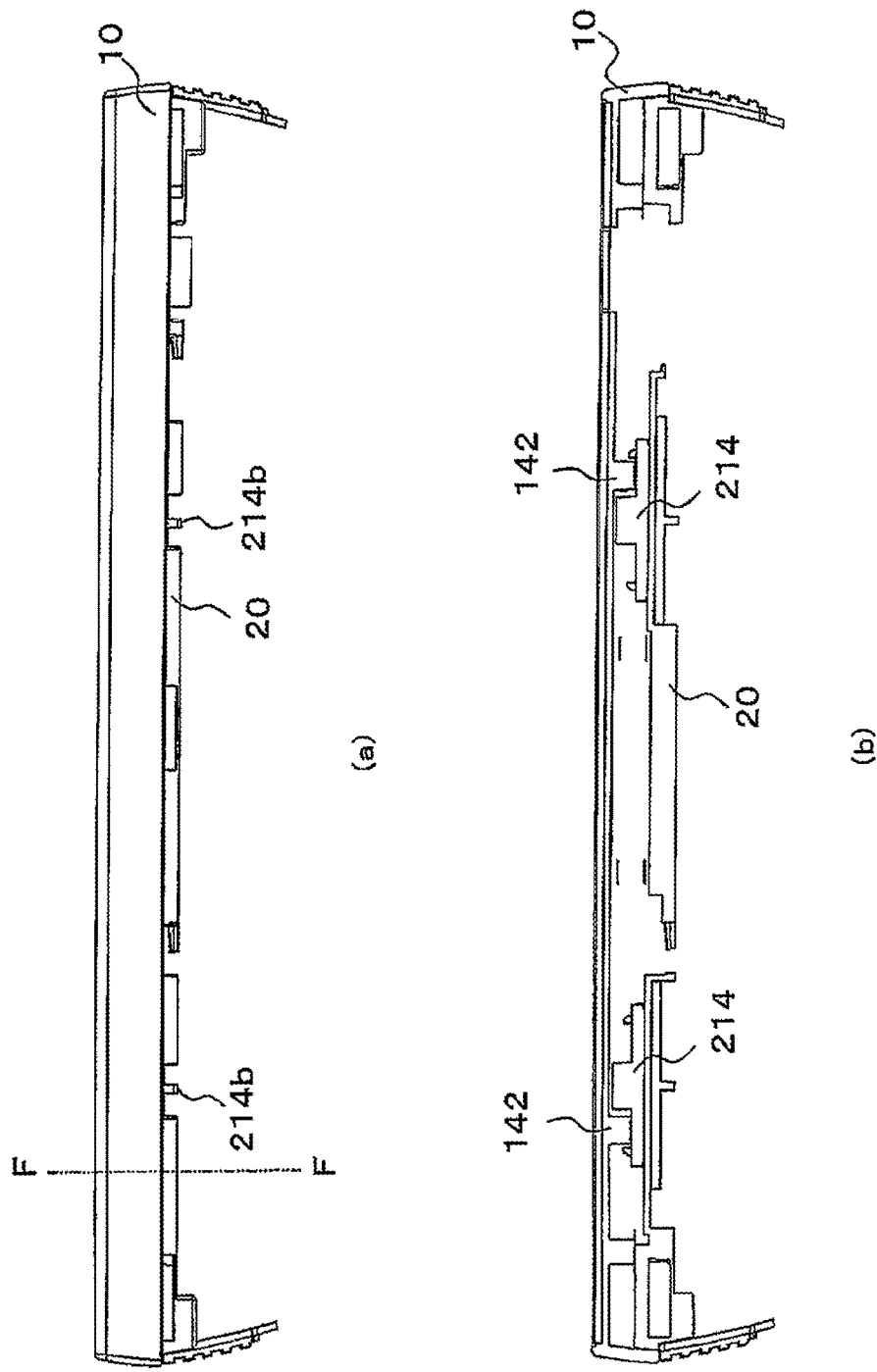
FIG. 18 includes views for illustrating the lock reminder mechanism of the display device, in which (a) is a top view and (b) is a view cut along the line E-E.

FIG. 18 are views for illustrating a state in which the lock levers 214 are at the first position, with the front case 10 mounted to the rear case 20. FIG. 18(*a*) is a top view. FIG. 18(*b*) is a view cut along the line E-E (see FIG. 16(*c*)). As illustrated in FIG. 18(*b*), the lock levers 214 are not positioned above the protruding portions 142 of the front case 10, which allows the front case 10 to move upward. As illustrated in FIG. 18(*a*), the knob portion of the lock lever operation portion 214*b* of each lock lever 214 is not contained in the outer frame 21 of the rear case 20, and protrudes to the outside of the outer frame 21.

Figure 19:
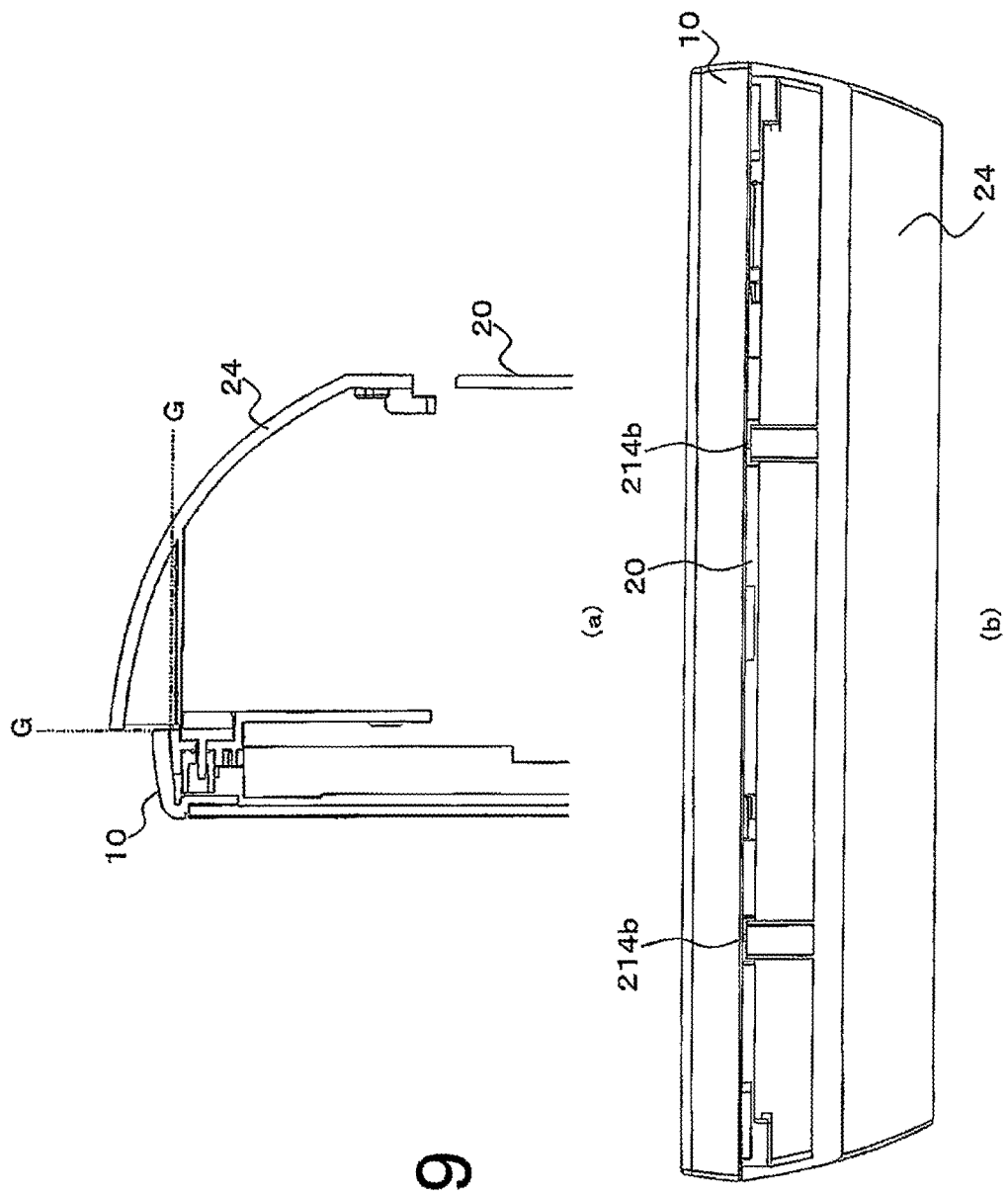
FIG. 19 includes views for illustrating the lock reminder mechanism of the display device, in which (a) is a sectional view taken along the line F-F in FIG. 18 when the top cover is to be mounted to the display device, and (b) is a partial sectional view of the display device that is cut out along the line G-G, as seen from top.

FIG. 19 are views for illustrating a state in which the top cover is to be mounted to the display device 2 that is illustrated in FIG. 18. FIG. 19(*a*) is a sectional view taken along the line F-F (see FIG. 18(*a*)). FIG. 19(*b*) is a partial sectional view of the display device 2 that is cut out along the line G-G, as seen from top. As illustrated in FIG. 19(*a*) and FIG. 19(*b*), the protruding portions 242 of the top cover 24 are brought into abutment against the knob portions of the lock lever operation portions 214*b*, thereby preventing the top cover 24 from being mounted to the rear case 20. This informs the worker (user) that the lock levers 214 are not at the second position, in other words, that the worker (user) has forgotten to lock.

The embodiment of this invention described above has the following effects.

A first effect is that a display device having a simple structure and excellent maintainability can be provided because the display device 2 according to this embodiment is structured so as to regulate the movement of the front case 10 with the use of the lock levers 214 after engagement portions of the front case 10 to which the touch panel 11 is installed and engagement portions of the rear case 20 to which the display unit 26 is installed are engaged with each other.

A second effect is that a worker (user) can recognize that the movement of the front case 10 is not regulated, owing to the structure in which the knob portion of the lock lever operation portion 214*b* prevents the top cover 24 from being mounted when the lock lever 214 is at the first position (unlocking position).

In the embodiment described above, the front case 10 is mounted to the rear case 20 by engaging the engagement protrusions 144, which are provided on the inside of the side portions of the front case 10 on the right and on the left, the engagement protrusions 141, which are provided on the inside of the top portion of the front case 10, and the engagement protrusions 143, which are provided on the inside of the bottom portion of the front case 10, with the guide grooves 212, which are provided in the side portions of the rear case 20 on the right and on the left, the engagement recessed portions 211, which are provided in the top portion of the rear case 20, and the engagement recessed portions 213, which are provided in the bottom portion of the rear case 20. The front case 10 may instead be mounted to the rear case 20 by engaging the engagement protrusions 144, which are provided on the inside of the side portions of the front case 10 on the right and on the left, and the engagement protrusions 141 and 143, which are provided on the inside of the top portion or bottom portion of the front case 10, with the guide grooves 212, which are provided in the side portions of the rear case 20 on the right and on the left, and the engagement recessed portions 211 and 213, which are provided in the top portion or bottom portion of the rear case 20, or by engaging the engagement protrusions 144, which are provided on the inside of the side portions of the front case 10 on the right and on the left, with the guide grooves 212, which are provided in the side portions of the rear case 20 on the right and on the left.

In the embodiment described above, the guide grooves 212 are provided in the side portions of the rear case 20 on the right and on the left, and the engagement protrusions 144 are provided on the inside of the side portions of the front case 10 on the right and on the left. Engagement protrusions may instead be provided in the side portions of the rear case 20 on the right and on the left, while guide grooves (extending upward) are provided on the inside of the side portions of the front case 10 on the right and on the left.

The top cover 24 and the rear cover 25 are provided separately as covers that cover the reverse side of the rear case 20 in the embodiment described above. Alternatively, the top cover 24 and the rear cover 25 may be integrated into one rear cover. The side covers 23 may also be integrated with the top cover 24 and the rear cover 25 into one rear cover.

In the embodiment described above, the guide grooves 212 are provided in the side portions of the rear case 20 on the right and on the left, the engagement protrusions 144 are provided on the inside of the side portions of the front case 10 on the right and on the left, and the guide grooves 212 and the engagement protrusions 144 are engaged with each other by bringing the front case 10 into contact with the rear case 20 and then pulling the front case 10 downward. However, this embodiment is not limited to the above-mentioned configuration. For example, guide grooves provided in the top portion and the bottom portion of the rear case 20 may be engaged with the engagement protrusions 144 that are provided on the inside of the top portion of the front case 10 and on the inside of the bottom portion of the front case 10 as engagement protrusions corresponding to the guide grooves, by bringing the front case 10 into contact with the rear case 20 and then moving the front case 10 in a direction of the side portions. In short, the front case 10 is mounted to the rear case 20 by one of leftward movement and rightward movement. Then protruding portions are provided in one of the sides of the front case 10, and the lock levers 214 are provided in the corresponding side of the rear case 20. In this case, the protruding portions of one of the side covers 23 are brought into abutment against the lock levers 214 and the side cover 24 cannot be mounted to the rear case 20 when the lock levers 214 are in the unlocking position, and a user or a worker thus can recognize that the user or worker has forgotten to lock.

The numbers of the engagement protrusions and protruding portions of the front cover 10 and the numbers of the lock levers, guide grooves, engagement holes, and engagement recessed portions of the rear cover 20 that are given in the embodiment are mere examples. For each of the engagement portions, four, five, or any suitable number of pieces of the engagement portion can be formed. The same applies to the engagement portions of the side covers 23, the top cover 24, and the rear cover 25.

As a matter of course, this invention is not limited to the embodiment described above, and may be modified into various modes within the technical scope described in the claims. For example, this invention is not limited to POS terminal devices, and is applicable to other electronic devices that include a display device with a touch panel, such as personal digital assistants (PDAs), personal computers, digital cameras, movie cameras, game machines, display equipment, and television devices.

This invention is described above in detail based on the embodiment of this invention. However, it is needless to say that this invention is not limited to the above-mentioned embodiment, and various modifications can be made without departing from the gist of this invention.

This application claims priority from Japanese Patent Application No. 2015-099951, filed on May 15, 2015, the entire disclosure of which is incorporated herein by reference.

REFERENCE SIGNS LIST

1 POS terminal device
2 display device
3 base
4 tilt hinge unit
10 front case
11 touch panel
12 connection cable
13 double-side coated tape
14 front bezel
141 engagement protrusion
142 protruding portion
143 engagement protrusion
144 engagement protrusion
20 rear case
21 outer frame
211 engagement recessed portion
212 guide groove
213 engagement recessed portion
214 lock lever
214a lock lever regulation portion
214b lock lever operation portion
215 top cover positioning recessed portion
216 top cover engagement hole
217 rear cover protruding portion contact position
218 rear cover engagement hole
219 screwing hole
22 inner frame
221 screwing protrusion
222 screw hole
23 side cover
24 top cover
241 engagement protrusion
242 protruding portion
243 engagement claw
244 engagement hole
245 first positioning protrusion
246 second positioning protrusion
25 rear cover
251 engagement protrusion
252 protruding portion
253 engagement protrusion
26 display unit

The invention claimed is:

1. A display device, comprising:
a front case comprising a touch panel; and
a rear case comprising a lock unit, which is configured to regulate movement of the front case, and a display unit,
wherein the front case is provided with a protrusion that is formed in a peripheral edge portion of the front case and that is inserted into a guide groove formed in an outer edge portion of the rear case, the front case being brought into contact with the rear case and further moved along the guide groove to be brought into a state where the protrusion is engaged with the guide groove, and
the front case is mounted on the rear case in a state where the lock unit of the rear case is moved from a first position at which the movement of the front case is not regulated, to a second position which is different from the first position and at which the movement of the front case is regulated;

wherein the front case comprises a protruding portion formed in one end portion of the front case, and wherein, in a state where the lock unit of the rear case is moved from the first position to the second position different from the first position, the protruding portion and the lock unit are at least partially overlapped with each other in a direction in which the front case moves along the guide groove.

2. A display device according to claim 1, wherein the front case comprises engagement protrusions formed in a top peripheral edge portion and a bottom peripheral edge portion of the front case, wherein the rear case comprises engagement recessed portions which are formed in a top outer edge portion and a bottom outer edge portion of the rear case and which correspond to the engagement protrusions of the front case, and wherein, in a state where the front case is moved along the guide groove, the engagement protrusions formed in the top peripheral edge portion and the bottom peripheral edge portion of the front case are engaged with the engagement recessed portions formed in the top outer edge portion and the bottom outer edge portion of the rear case.

3. A display device according to claim 1, wherein the rear case comprises a cover removably mounted to the rear case, wherein, in a state where the lock unit is at the first position, a part of the cover is brought into abutment against a part of the lock unit, on mounting the cover, to cause a state where the cover is prevented from being mounted, and wherein, in a state where the lock unit is at the second position, a part of the cover is not brought into abutment against a part of the lock unit, on mounting the cover, to cause a state where the cover is allowed to be mounted.

4. A method of manufacturing a display device which comprises a front case with a touch panel and a rear case comprising a lock unit, which is configured to regulate movement of the front case, and a display unit, the method comprising:

inserting a protrusion formed in a peripheral edge portion of the front case into a guide groove formed in an outer edge portion of the rear case to bring the front case into contact with the rear case;

subsequently moving the front case along the guide groove so as to engage the protrusion with the guide groove;

moving the lock unit of the rear case from a first position at which movement of the front case is not regulated to a second position which is different from the first position and at which the movement of the front case is regulated;

thereby mounting the front case to the rear case;

wherein the front case comprises protruding portions formed at one end portion thereof, the method comprising:

moving the lock unit of the rear case from the first position to the second position different from the first position so that the protruding portions and the lock unit are at least partially overlapped with each other in a direction in which the front case moves along the guide groove.

5. A method of manufacturing a display device, according to claim 4, wherein the front case comprises engagement protrusions formed in a top peripheral edge portion and a bottom peripheral edge portion of the front case, wherein the rear case comprises engagement recessed portions which are formed in a top outer edge portion and a bottom outer edge portion of the rear case and which correspond to the engagement protrusions of the front case;

the method comprising:

moving the front case along the guide groove, thereby engaging the engagement protrusions formed in the top peripheral edge portion and the bottom peripheral edge portion of the front case with the engagement recessed portions formed in the top outer edge portion and the bottom outer edge portion of the rear case.

6. A method of manufacturing a display device, according to claim 4, wherein the rear case comprises a cover removably mounted;

the method comprising:

moving the lock unit to the first position so that a part of the cover is brought into abutment against a part of the lock unit, on mounting the cover, to cause a state where the cover is prevented from being mounted, and moving the lock unit to the second position so that a part of the cover is not contacted with a part of the lock unit, on mounting the cover, to cause a state where the cover is allowed to be mounted.

* * * * *

UNITED STATES PATENT AND TRADEMARK OFFICE
CERTIFICATE OF CORRECTION

PATENT NO.         : 10,178,783 B2
APPLICATION NO.    : 15/571070
DATED              : January 8, 2019
INVENTOR(S)        : Shinichirou Yonemaru, Katsumi Harashima and Takahiro Iwamoto It is certified that error appears in the above-identified patent and that said Letters Patent is hereby corrected as shown below:

In the Specification

Column 4, Mode(S) for Embodying the Invention, Line 2; Delete "(a." and insert --(a-- therefor Signed and Sealed this
Eighteenth Day of June, 2019

Andrei Iancu
*Director of the United States Patent and Trademark Office*